(12) United States Patent
Renn et al.

(10) Patent No.: US 9,241,401 B2
(45) Date of Patent: Jan. 19, 2016

(54) SOLID STATE LIGHTING DEVICE AND METHOD EMPLOYING HEAT EXCHANGER THERMALLY COUPLED CIRCUIT BOARD

(75) Inventors: John O. Renn, Lake Forest Park, WA (US); William G. Reed, Seattle, WA (US); Bradley B. Larsen, Seattle, WA (US)

(73) Assignee: Express Imaging Systems, LLC, Renton, WA (US)

( * ) Notice: Subject to any disclaimer, the term of this patent is extended or adjusted under 35 U.S.C. 154(b) by 98 days.

(21) Appl. No.: 13/166,626

(22) Filed: Jun. 22, 2011

(65) Prior Publication Data

US 2011/0310605 A1    Dec. 22, 2011

Related U.S. Application Data

(60) Provisional application No. 61/357,421, filed on Jun. 22, 2010.

(51) Int. Cl.
*B60Q 1/06* (2006.01)
*H05K 1/02* (2006.01)
(Continued)

(52) U.S. Cl.
CPC .............. *H05K 1/0278* (2013.01); *F21V 7/041* (2013.01); *F21V 19/0035* (2013.01); *F21V 19/0055* (2013.01); *F21V 29/777* (2015.01); *F21S 8/08* (2013.01); *F21V 7/0058* (2013.01); *F21V 13/02* (2013.01); *F21W 2131/103* (2013.01); *F21Y 2101/02* (2013.01); *F21Y 2103/022* (2013.01); *F21Y 2111/004* (2013.01);
(Continued)

(58) Field of Classification Search
CPC .............. F21S 4/00; F21S 2/00; F01D 5/146; F21Y 2101/00; F21V 15/00; F21V 1/00
USPC ........... 362/294, 800, 249.01, 249.02, 249.04
See application file for complete search history.

(56) References Cited

U.S. PATENT DOCUMENTS 4,153,927 A    5/1979  Owens
4,237,377 A   12/1980  Sansum
(Continued)

FOREIGN PATENT DOCUMENTS

DE            4001980      8/1990
DE       198 10 827 A1    9/1999
(Continued)

OTHER PUBLICATIONS

Reed et al., "Apparatus, Method to Change Light Source Color Temperature with Reduced Optical Filtering Losses," U.S. Appl. No. 61/295,519, filed Jan. 15, 2010, 35 pages.
(Continued)

*Primary Examiner* — Anh Mai
*Assistant Examiner* — Jessica M Apenteng
(74) *Attorney, Agent, or Firm* — Seed IP Law Group PLLC

(57) ABSTRACT

An illumination device comprises a circuit board that carries solid-state light sources and a heat transfer structure to which the circuit board is intimately physically coupled such that the circuit board is curved along at least one of a longitudinal dimension or a lateral dimension thereof. Such may allow less fasteners to be used than would otherwise be possible, while maintaining close contact over a large portion of the surface area. Some embodiments may employ a clamp, for example a peripheral clamp such as a cover or bezel clamp.

20 Claims, 12 Drawing Sheets

(51) Int. Cl.

| | | |
|---|---|---|
| *F21V 19/00* | (2006.01) | |
| *F21V 7/04* | (2006.01) | |
| *F21V 29/77* | (2015.01) | |
| *F21W 131/103* | (2006.01) | |
| *F21Y 101/02* | (2006.01) | |
| *F21Y 103/02* | (2006.01) | |
| *F21Y 111/00* | (2006.01) | |
| *H05K 3/00* | (2006.01) | |
| *F21S 8/08* | (2006.01) | |
| *F21V 7/00* | (2006.01) | |
| *F21V 13/02* | (2006.01) | |

(52) U.S. Cl.
CPC ........ *F21Y 2111/005* (2013.01); *H05K 1/0203* (2013.01); *H05K 3/0061* (2013.01); *H05K 2201/09018* (2013.01); *H05K 2201/09027* (2013.01); *H05K 2201/10106* (2013.01); *H05K 2201/10409* (2013.01); *Y10T 29/49124* (2015.01)

(56) References Cited

U.S. PATENT DOCUMENTS

| | | | |
|---|---|---|---|
| 4,811,176 A | 3/1989 | Myhres | |
| 5,086,379 A | 2/1992 | Denison et al. | |
| 5,150,009 A | 9/1992 | Kling et al. | |
| 5,160,202 A | 11/1992 | Légaré | 362/153.1 |
| 5,230,556 A | 7/1993 | Canty et al. | |
| 5,274,350 A | 12/1993 | Larson | |
| 5,349,505 A | 9/1994 | Poppenheimer | |
| 5,450,302 A | 9/1995 | Maase et al. | |
| 5,948,829 A | 9/1999 | Wallajapet et al. | |
| 6,094,919 A | 8/2000 | Bhatia | 62/3.7 |
| 6,111,739 A | 8/2000 | Wu et al. | 361/106 |
| 6,149,283 A | 11/2000 | Conway et al. | |
| 6,230,497 B1 | 5/2001 | Morris et al. | 62/3.7 |
| D447,266 S | 8/2001 | Verfuerth | |
| 6,400,101 B1 | 6/2002 | Biebl et al. | |
| D460,735 S | 7/2002 | Verfuerth | |
| D463,059 S | 9/2002 | Verfuerth | |
| 6,499,860 B2 | 12/2002 | Begemann | |
| 6,585,396 B1 | 7/2003 | Verfuerth | |
| 6,601,972 B2 | 8/2003 | Sei et al. | 362/236 |
| D479,826 S | 9/2003 | Verfuerth et al. | |
| 6,612,720 B1 | 9/2003 | Beadle | |
| D483,332 S | 12/2003 | Verfuerth | |
| 6,753,842 B1 | 6/2004 | Williams et al. | |
| 6,758,580 B1 | 7/2004 | Verfuerth | |
| 6,787,999 B2 | 9/2004 | Stimac et al. | |
| 6,847,156 B2 | 1/2005 | Kim | |
| 6,885,134 B2 | 4/2005 | Kurashima et al. | 313/46 |
| 6,902,292 B2 | 6/2005 | Lai | |
| 6,948,829 B2 | 9/2005 | Verdes et al. | 362/227 |
| 6,964,501 B2 | 11/2005 | Ryan | 362/294 |
| 6,964,502 B1 | 11/2005 | Verfuerth | |
| 7,066,622 B2 | 6/2006 | Alessio | |
| 7,111,961 B2 | 9/2006 | Trenchard et al. | |
| 7,144,140 B2 | 12/2006 | Sun et al. | 362/373 |
| 7,145,179 B2 | 12/2006 | Petroski | |
| 7,165,866 B2 | 1/2007 | Li | 362/294 |
| D538,462 S | 3/2007 | Verfuerth et al. | |
| 7,188,967 B2 | 3/2007 | Dalton et al. | |
| 7,213,940 B1 | 5/2007 | Van De Ven et al. | 362/231 |
| 7,239,087 B2 | 7/2007 | Ball | 315/128 |
| 7,252,385 B2 | 8/2007 | Engle et al. | 353/52 |
| 7,281,820 B2 | 10/2007 | Bayat et al. | |
| D557,817 S | 12/2007 | Verfuerth | |
| D560,469 S | 1/2008 | Bartol et al. | |
| 7,314,261 B2 | 1/2008 | Jackson Pulver et al. | 347/9 |
| 7,317,403 B2 | 1/2008 | Grootes et al. | 340/815.45 |
| 7,330,002 B2 | 2/2008 | Joung | 315/309 |
| 7,339,323 B2 | 3/2008 | Bucur | 315/128 |
| 7,341,362 B2 | 3/2008 | Bjornson et al. | 362/294 |
| 7,387,403 B2 | 6/2008 | Mighetto | 362/218 |
| 7,401,942 B1 | 7/2008 | Verfuerth et al. | |
| 7,438,440 B2 | 10/2008 | Dorogi | 362/294 |
| 7,458,330 B2 | 12/2008 | MacDonald et al. | 114/177 |
| 7,461,964 B1 | 12/2008 | Aubrey | |
| 7,475,002 B1 | 1/2009 | Mann | 703/23 |
| 7,524,089 B2 | 4/2009 | Park | 362/294 |
| 7,549,773 B2 | 6/2009 | Lim | |
| D595,894 S | 7/2009 | Verfuerth et al. | |
| 7,556,406 B2 | 7/2009 | Petroski et al. | 362/294 |
| 7,559,674 B2 | 7/2009 | He et al. | |
| 7,563,006 B1 | 7/2009 | Verfuerth et al. | |
| 7,575,338 B1 | 8/2009 | Verfuerth | |
| 7,578,596 B2 | 8/2009 | Martin | |
| 7,581,856 B2 * | 9/2009 | Kang et al. | 362/373 |
| 7,595,595 B2 | 9/2009 | Mehta | |
| D606,697 S | 12/2009 | Verfuerth et al. | |
| D606,698 S | 12/2009 | Verfuerth et al. | |
| 7,626,342 B2 | 12/2009 | Sun et al. | 315/247 |
| 7,628,506 B2 | 12/2009 | Verfuerth et al. | |
| 7,635,203 B2 | 12/2009 | Weaver, Jr. et al. | |
| 7,637,633 B2 | 12/2009 | Wong | 362/294 |
| 7,665,862 B2 | 2/2010 | Villard | |
| 7,695,160 B2 | 4/2010 | Hirata et al. | 362/264 |
| 7,703,951 B2 | 4/2010 | Piepgras et al. | |
| D617,028 S | 6/2010 | Verfuerth et al. | |
| D617,029 S | 6/2010 | Verfuerth et al. | |
| 7,748,879 B2 | 7/2010 | Koike et al. | |
| 7,762,861 B2 | 7/2010 | Verfuerth et al. | |
| 7,766,507 B2 | 8/2010 | Nakajima | |
| 7,766,508 B2 | 8/2010 | Villard et al. | |
| 7,780,310 B2 | 8/2010 | Verfuerth et al. | |
| D623,340 S | 9/2010 | Verfuerth et al. | |
| 7,857,497 B2 | 12/2010 | Koike et al. | |
| 7,874,699 B2 | 1/2011 | Liang | |
| 7,874,710 B2 | 1/2011 | Tsai et al. | 362/373 |
| D632,006 S | 2/2011 | Verfuerth et al. | |
| 7,901,107 B2 | 3/2011 | Van De Ven et al. | 362/231 |
| 8,018,135 B2 | 9/2011 | Van De Ven et al. | |
| 8,057,070 B2 | 11/2011 | Negley et al. | |
| D650,225 S | 12/2011 | Bartol et al. | |
| 8,070,312 B2 | 12/2011 | Verfuerth et al. | |
| 8,118,450 B2 | 2/2012 | Villard | |
| 8,136,958 B2 | 3/2012 | Verfuerth et al. | |
| 8,186,855 B2 | 5/2012 | Wassel et al. | |
| RE43,456 E | 6/2012 | Verfuerth et al. | |
| 8,254,137 B2 * | 8/2012 | Wilkolaski et al. | 361/752 |
| 8,302,677 B2 | 11/2012 | Havinga | |
| 8,324,641 B2 | 12/2012 | Yan et al. | |
| 8,337,043 B2 | 12/2012 | Verfuerth et al. | |
| 8,376,583 B2 | 2/2013 | Wang et al. | |
| 8,408,739 B2 | 4/2013 | Villard et al. | |
| 8,637,877 B2 | 1/2014 | Negley | |
| 8,646,944 B2 | 2/2014 | Villard | |
| 8,764,237 B2 | 7/2014 | Wang et al. | |
| 8,794,804 B2 | 8/2014 | Verfuerth et al. | |
| 8,816,576 B1 * | 8/2014 | Erion et al. | 313/46 |
| 8,858,019 B2 | 10/2014 | Novak et al. | |
| 8,866,582 B2 | 10/2014 | Verfuerth et al. | |
| 2003/0123521 A1 | 7/2003 | Luoma | |
| 2004/0095772 A1 | 5/2004 | Hoover et al. | 362/363 |
| 2004/0105264 A1 | 6/2004 | Spero | 362/276 |
| 2004/0120148 A1 | 6/2004 | Morris et al. | 362/264 |
| 2004/0120156 A1 | 6/2004 | Ryan | |
| 2005/0057187 A1 | 3/2005 | Catalano | |
| 2005/0135101 A1 | 6/2005 | Richmond | 362/276 |
| 2005/0146884 A1 * | 7/2005 | Scheithauer | 362/470 |
| 2005/0174780 A1 | 8/2005 | Park | 362/294 |
| 2005/0231133 A1 | 10/2005 | Lys | |
| 2005/0243022 A1 | 11/2005 | Negru | 345/46 |
| 2005/0254013 A1 | 11/2005 | Engle et al. | 353/52 |
| 2005/0265019 A1 * | 12/2005 | Sommers et al. | 362/217 |
| 2006/0001384 A1 | 1/2006 | Tain et al. | 315/246 |
| 2006/0056172 A1 | 3/2006 | Fiene | 362/147 |
| 2006/0098440 A1 | 5/2006 | Allen | 362/294 |
| 2006/0158130 A1 | 7/2006 | Furukawa | 315/200 R |
| 2006/0202914 A1 | 9/2006 | Ashdown | 345/46 |
| 2006/0277823 A1 | 12/2006 | Barnett et al. | 47/33 |
| 2007/0096118 A1 | 5/2007 | Mahalingam et al. | 257/81 |
| 2007/0102033 A1 | 5/2007 | Petrocy | 136/203 |

(56) References Cited

U.S. PATENT DOCUMENTS

| | | | |
|---|---|---|---|
| 2007/0139961 A1* | 6/2007 | Cheah et al. | 362/612 |
| 2007/0147046 A1 | 6/2007 | Arik et al. | |
| 2007/0153550 A1 | 7/2007 | Lehman et al. | |
| 2007/0183156 A1* | 8/2007 | Shan | 362/277 |
| 2007/0230183 A1 | 10/2007 | Shuy | 362/294 |
| 2007/0247853 A1 | 10/2007 | Dorogi | 362/294 |
| 2007/0279921 A1 | 12/2007 | Alexander et al. | 362/368 |
| 2007/0285000 A1 | 12/2007 | Lim et al. | |
| 2007/0285920 A1 | 12/2007 | Seabrook | 362/240 |
| 2007/0297184 A1 | 12/2007 | Isely | |
| 2008/0106907 A1 | 5/2008 | Trott et al. | |
| 2008/0130304 A1 | 6/2008 | Rash et al. | |
| 2008/0205068 A1 | 8/2008 | Neeld et al. | |
| 2008/0232116 A1 | 9/2008 | Kim | |
| 2008/0232119 A1 | 9/2008 | Ribarich | 362/373 |
| 2008/0253125 A1 | 10/2008 | Kang et al. | 362/294 |
| 2008/0266839 A1 | 10/2008 | Claypool et al. | |
| 2008/0298058 A1* | 12/2008 | Kan et al. | 362/240 |
| 2008/0309240 A1 | 12/2008 | Goray et al. | 315/56 |
| 2009/0000217 A1 | 1/2009 | Verfuerth et al. | |
| 2009/0001372 A1 | 1/2009 | Arik et al. | |
| 2009/0109625 A1 | 4/2009 | Booth et al. | 361/702 |
| 2009/0161356 A1 | 6/2009 | Negley et al. | |
| 2009/0225540 A1 | 9/2009 | Chen | |
| 2009/0244899 A1 | 10/2009 | Chyn | |
| 2009/0278474 A1 | 11/2009 | Reed et al. | 315/294 |
| 2009/0278479 A1 | 11/2009 | Platner et al. | |
| 2009/0284155 A1 | 11/2009 | Reed et al. | 315/32 |
| 2010/0008090 A1* | 1/2010 | Li et al. | 362/249.03 |
| 2010/0053962 A1* | 3/2010 | Mo et al. | 362/249.01 |
| 2010/0060130 A1 | 3/2010 | Li | 313/46 |
| 2010/0084979 A1 | 4/2010 | Burton et al. | |
| 2010/0090577 A1 | 4/2010 | Reed et al. | 313/46 |
| 2010/0123403 A1 | 5/2010 | Reed | 315/193 |
| 2010/0149822 A1 | 6/2010 | Cogliano et al. | |
| 2010/0177519 A1 | 7/2010 | Schlitz | |
| 2010/0246168 A1 | 9/2010 | Verfuerth et al. | |
| 2010/0277082 A1 | 11/2010 | Reed et al. | 315/159 |
| 2010/0277914 A1 | 11/2010 | Bachl et al. | |
| 2010/0277917 A1 | 11/2010 | Shan | |
| 2010/0290236 A1 | 11/2010 | Gingrich, III et al. | |
| 2010/0295946 A1 | 11/2010 | Reed et al. | 348/164 |
| 2010/0328947 A1* | 12/2010 | Chang et al. | 362/249.02 |
| 2011/0001626 A1 | 1/2011 | Yip et al. | |
| 2011/0026264 A1 | 2/2011 | Reed et al. | 362/373 |
| 2011/0090686 A1 | 4/2011 | Pickard | |
| 2011/0175518 A1 | 7/2011 | Reed et al. | |
| 2011/0176297 A1* | 7/2011 | Hsia et al. | 362/217.1 |
| 2011/0235317 A1 | 9/2011 | Verfuerth et al. | |
| 2012/0081906 A1 | 4/2012 | Verfuerth et al. | |
| 2012/0224363 A1 | 9/2012 | Van De Ven | |
| 2013/0193857 A1 | 8/2013 | Tlachac et al. | |
| 2013/0308325 A1 | 11/2013 | Verfuerth et al. | |
| 2014/0140052 A1 | 5/2014 | Villard | |
| 2014/0313719 A1 | 10/2014 | Wang et al. | |
| 2014/0339390 A1 | 11/2014 | Verfuerth et al. | |
| 2015/0028770 A1 | 1/2015 | Verfuerth et al. | |

FOREIGN PATENT DOCUMENTS

| | | | |
|---|---|---|---|
| EP | 1 734 795 A1 | 12/2006 | |
| FR | 2883306 | 9/2006 | |
| JP | 2001-333420 A | 11/2001 | |
| JP | 2004-349065 A | 12/2004 | |
| JP | 2006-31977 A | 2/2006 | |
| JP | 2006-244711 A | 9/2006 | |
| KR | 1020080094344 * | 9/2005 | H01L 33/00 |
| KR | 10-2012-0108662 A | 10/2012 | |
| WO | 02/076068 A1 | 9/2002 | |
| WO | 03/056882 A1 | 7/2003 | |
| WO | 2006/057866 | 6/2006 | |
| WO | 2007/036873 A2 | 4/2007 | |
| WO | 2008/030450 | 3/2008 | |
| WO | 2009/040703 | 4/2009 | |
| WO | 2009/105168 A2 | 8/2009 | |
| WO | 2011/005441 A2 | 1/2011 | |
| WO | 2011/019806 A2 | 2/2011 | |
| WO | 2012/033750 A1 | 3/2012 | |
| WO | 2015/039120 A1 | 3/2015 | |

OTHER PUBLICATIONS

Renn et al., "Solid State Lighting Device and Method Employing Heat Exchanger Thermally Coupled Circuit Board," U.S. Appl. No. 61/357,421, filed Jun. 22, 2010, 49 pages.

International Search Report, mailed Jul. 9, 2009 for PCT/US2009/043171, 3 pages.

Written Opinion, mailed Jul. 9, 2009 for PCT/US2009/043171, 8 pages.

International Search Report, mailed Jun. 21, 2010 for PCT/US2009/064625, 3 pages.

Written Opinion, mailed Jun. 21, 2010 for PCT/US2009/064625, 5 pages.

International Search Report, mailed Jun. 10, 2009 for PCT/US2009/043170, 4 pages.

Written Opinion, mailed Jun. 10, 2009 for PCT/US2009/043170, 7 pages.

International Search Report, mailed Nov. 29, 2010 for PCT/US2010/033000, 3 pages.

Written Opinion, mailed Nov. 29, 2010 for PCT/US2010/033000, 5 pages.

Reed, "Electronic Control to Regulate Power for Solid-State Lighting and Methods Thereof," U.S. Appl. No. 61/154,619, filed Feb. 23, 2009, 62 pages.

Reed et al., "Low-Profile Pathway Illumination System," U.S. Appl. No. 61/051,619, filed May 8, 2008, 25 pages.

Reed et al., "Gas-Discharge Lamp Replacement," U.S. Appl. No. 61/052,924, filed May 13, 2008, 32 pages.

Reed et al., "Turbulent Flow Cooling for Electronic Ballast," U.S. Appl. No. 61/088,651, filed Aug. 13, 2008, 23 pages.

Reed, "Electronic Control to Regulate Power for Solid-State Lighting and Methods Thereof," U.S. Appl. No. 61/115,438, filed Nov. 17, 2008, 51 pages.

Reed et al., "Gas-Discharge Lamp Replacement with Passive Cooling," U.S. Appl. No. 61/174,913, filed May 1, 2009, 29 pages.

Reed et al., "Long-Range Motion Detection for Illumination Control," U.S. Appl. No. 61/180,017, filed May 20, 2009, 32 pages.

Reed et al., "Electrically Isolated Heat Sink for Solid-State Light," U.S. Appl. No. 61/229,435, filed Jul. 29, 2009, 29 pages.

Reed et al., "Gas-Discharge Lamp Replacement," Office Action mailed Jun. 22, 2011 for U.S. Appl. No. 12/437,467, 12 pages.

Reed et al., "Turbulent Flow Cooling for Electronic Ballast," Office Action mailed Dec. 29, 2010 for U.S. Appl. No. 12/540,250, 16 pages.

Reed et al., "Turbulent Flow Cooling for Electronic Ballast," Amendment filed Apr. 29, 2011 for U.S. Appl. No. 12/540,250, 11 pages.

Reed et al., "Turbulent Flow Cooling for Electronic Ballast," Office Action mailed Jul. 20, 2011 for U.S. Appl. No. 12/540,250, 15 pages.

"A Review of the Literature on Light Flicker: Ergonomics, Biological Attributes, Potential Health Effects, and Methods in Which Some LED Lighting May Introduce Flicker," IEEE Standard P1789, Feb. 26, 2010, 26 pages.

International Search Report, mailed Sep. 29, 2011 for PCT/US2011/041402, 3 pages.

Reed et al., "Gas-Discharge Lamp Replacement," Amendment filed Sep. 6, 2011 for U.S. Appl. No. 12/437,467, 14 pages.

Reed et al., "Turbulent Flow Cooling for Electronic Ballast," Amendment filed Oct. 14, 2011 for U.S. Appl. No. 12/540,250, 12 pages.

Written Opinion, mailed Sep. 29, 2011 for PCT/US2011/041402, 4 pages.

Reed et al., "Gas-Discharge Lamp Replacement," Office Action mailed Nov. 17, 2011 for U.S. Appl. No. 12/437,467, 15 pages.

Reed et al., "Turbulent Flow Cooling for Electronic Ballast," Office Action mailed Jan. 5, 2012 for U.S. Appl. No. 12/540,250, 12 pages.

International Search Report, mailed Dec. 13, 2010 for PCT/US2010/035649, 3 pages.

(56) References Cited

OTHER PUBLICATIONS

International Search Report, mailed Dec. 15, 2010 for PCT/US2010/035658, 3 pages.
International Search Report, mailed Dec. 28, 2010 for PCT/US2010/035651, 3 pages.
International Search Report, mailed Oct. 8, 2012 for PCT/US2012/033059, 3 pages.
Reed et al., "Gas-Discharge Lamp Replacement," Amendment filed Apr. 10, 2012 for U.S. Appl. No. 12/437,467, 22 pages.
Reed et al., "Gas-Discharge Lamp Replacement," Amendment filed Sep. 7, 2012 for U.S. Appl. No. 12/437,467, 9 pages.
Reed et al., "Gas-Discharge Lamp Replacement," Office Action mailed Jan. 17, 2013, for U.S. Appl. No. 12/437,467, 12 pages.
Reed et al., "Gas-Discharge Lamp Replacement," Office Action mailed Jun. 12, 2012 for U.S. Appl. No. 12/437,467, 17 pages.
Reed et al., "Gas-Discharged Lamp Replacement," Office Action mailed Jun. 26, 2013, for U.S. Appl. No. 12/437,467, 15 pages.
Reed et al., "Electrically Isolated Heat Sink for Solid-State Light," Office Action mailed Apr. 4, 2013, for U.S. Appl. No. 12/846,516, 12 pages.
Reed et al., "Electrically Isolated Heat Sink for Solid-State Light," Office Action mailed Oct. 12, 2012, for U.S. Appl. No. 12/846,516 11 pages.
Reed et al., "Electrically Isolated Heat Sink for Solid-State Light," Response filed Jan. 14, 3013, for U.S. Appl. No. 12/846,516, 16 pages.
Reed et al., "Gas-Discharge Lamp Replacement with Passive Cooling," Office Action mailed Jul. 31, 2012 for U.S. Appl. No. 12/769,956, 15 pages.
Reed et al., "Gas-Discharge Lamp Replacement with Passive Cooling," Amendment filed Mar. 25, 2013 for U.S. Appl. No. 12/769,956, 13 pages.
Reed et al., "Gas-Discharge Lamp Replacement with Passive Cooling," Amendment filed Oct. 30, 2012 for U.S. Appl. No. 12/769,956, 12 pages.
Reed et al., "Gas-Discharge Lamp Replacement with Passive Cooling," Office Action mailed Nov. 26, 2012 for U.S. Appl. No. 12/769,956, 18 pages.
Reed et al., "Turbulent Flow Cooling for Electronic Ballast," Notice of Allowance mailed Aug. 15, 2012, for U.S. Appl. No. 12/540,250, 7 pages.
Reed et al., "Turbulent Flow Cooling for Electronic Ballast," Response filed Apr. 5, 2012 for U.S. Appl. No. 12/540,250, 8 pages.
Reed, "Apparatus and Method of Energy Efficient Illumination," U.S. Appl. No. 61/333,983, filed May 12, 2010, 57 pages.
Reed, "Apparatus and Method of Energy Efficient Illumination," U.S. Appl. No. 61/346,263, filed May 19, 2010, 67 pages.
Written Opinion, mailed Dec. 13, 2010 for PCT/US2010/035649, 4 pages.
Written Opinion, mailed Dec. 15, 2010 for PCT/US2010/035658, 3 pages.
Written Opinion, mailed Dec. 28, 2010 for PCT/US2010/035651, 3 pages.
Written Opinion, mailed Oct. 8, 2012 for PCT/US2012/033059, 3 pages.
Reed et al., "Gas-Discharge Lamp Replacement With Passive Cooling," Amendment filed Apr. 11, 2014, for U.S. Appl. No. 12/769,956, 16 pages.
Reed et al., "Gas-Discharge Lamp Replacement With Passive Cooling," Office Action mailed May 9, 2014, for U.S. Appl. No. 12/769,956, 22 pages.
Reed et al., "Gas-Discharge Lamp Replacement," Amendment filed Sep. 26, 2013, for U.S. Appl. No. 12/437,467, 20 pages.
Reed et al., "Gas-Discharge Lamp Replacement," Office Action mailed Jan. 30, 2014, for U.S. Appl. No. 12/437,467, 17 pages.
Reed et al., "Gas-Discharge Lamp Replacement With Passive Cooling," Office Action mailed Apr. 26, 2013, for U.S. Appl. No. 12/769,956, 20 pages.
Reed et al., "Gas-Discharge Lamp Replacement With Passive Cooling," Amendment filed Jul. 25, 2013, for U.S. Appl. No. 12/769,956, 12 pages.
Reed et al., "Gas-Discharge Lamp Replacement With Passive Cooling," Office Action mailed Aug. 28, 2013, for U.S. Appl. No. 12/769,956, 22 pages.
Reed et al., "Gas-Discharge Lamp Replacement With Passive Cooling," Amendment filed Nov. 27, 2013, for U.S. Appl. No. 12/769,956, 19 pages.
Reed et al., "Gas-Discharge Lamp Replacement With Passive Cooling," Office Action mailed Dec. 23, 2013, for U.S. Appl. No. 12/769,956, 18 pages.
International Search Report, mailed Dec. 30, 2014, for PCT/US2014/055909, 3 pages.
Written Opinion, mailed Dec. 30, 2014, for PCT/US2014/055909, 13 pages.
Reed et al., "Gas-Discharge Lamp Replacement," Amendment filed Jul. 30, 2014, for U.S. Appl. No. 12/437,467, 14 pages.
Reed et al., "Gas-Discharge Lamp Replacement" Notice of Allowance mailed Sep. 3, 2014, for U.S. Appl. No. 12/437,467, 8 pages.
Reed et al., "Gas-Discharge Lamp Replacement With Passive Cooling," Amendment filed Aug. 11, 2014, for U.S. Appl. No. 12/769,956, 15 pages.
Reed et al., "Gas-Discharge Lamp Replacement With Passive Cooling," Notice of Allowance mailed Aug. 29, 2014, for U.S. Appl. No. 12/769,956, 12 pages.
Reed, "Asset Management System for Outdoor Luminaires," U.S. Appl. No. 62/082,463, filed Nov. 20, 2014, 56 pages.
Reed, "Centralized Control of Area Lighting Hours of Illumination," U.S. Appl. No. 62/057,419, filed Sep. 30, 2014, 39 pages.
Reed, "Detection and Correction of Faulty Photo Controls in Outdoor Luminaires," U.S. Appl. No. 62/068,517, filed Oct. 24, 2014, 47 pages.
Renn et al., "Solid-State Lighting Devices and Systems," U.S. Appl. No. 14/488,069, filed Sep. 16, 2014, 33 pages.
Reed, "Luminaire With Adjustable Illumination Pattern," U.S. Appl. No. 62/114,826, filed Feb. 11, 2015, 68 pages.

* cited by examiner

SOLID STATE LIGHTING DEVICE AND METHOD EMPLOYING HEAT EXCHANGER THERMALLY COUPLED CIRCUIT BOARD

CROSS REFERENCE TO RELATED APPLICATION

This application claims benefit under 35 U.S.C. 119(e) of U.S. Provisional Patent Application Ser. No. 61/357,421, filed Jun. 22, 2010, which is incorporated herein by reference in its entirety.

BACKGROUND

1. Technical Field

This disclosure generally relates to illumination, and more particularly to apparatus and methods that employ a heat exchanger to cool solid-state light sources.

2. Description of the Related Art

With increasing trend of energy conservation and for various other reasons, solid-state lighting has become more and more popular as the source of illumination in a wide range of applications. As generally known, solid-state lighting refers to a type of lighting that emits light from a solid-state material, such as a block of semiconductor material. Such contrasts with more traditional forms of lighting, for example incandescent or fluorescent lighting which typically employ a filament in a vacuum tube or an electric discharge in a gas filled tube, respectively. Examples of solid-state light sources include light-emitting diodes (LEDs), organic light-emitting diodes (OLEDs), and polymer light-emitting diodes (PLEDs). Solid-state lighting devices typically require several solid-state light sources to produce a suitable level of illumination.

Solid-state light sources tend to have increased lifespan compared to traditional lighting. This is because solid-state light sources have a greater resistance to shock, vibration, and wear. Solid-state light sources generate visible light with reduced parasitic energy dissipation (i.e., reduced heat generation) as compared to traditional lighting. Nevertheless, solid-state light sources do generate heat and excess heat needs to be removed to protect the solid-state lighting sources from damage.

Some illumination devices use a heat exchanger (e.g., heat sink) to remove heat from the light sources. Heat exchangers such as heat sinks are typically made of materials with high thermal conductivity, for example metals such as aluminum and copper, and which are also electrically conductive. Less commonly, heats exchangers may be electrically non-conductive, to provide electrical isolation with respect to the various components of the illumination device. Electrically non-conductive heat exchangers are typically made of an electrically non-conductive polymer loaded with electrically non-conductive particles such as boron nitride or other ceramic materials. However, electrically non-conductive heat exchangers tend to have very low thermal conductivity relative to electrically conductive heat exchangers. Electrically non-conductive heat exchangers are also typically more expensive than electrically conductive heat exchangers.

Solid-state light sources are typically soldered or adhesively bonded to a printed circuit board (PCB). The PCB may, for example, take the form of a "metal core" type or an "enhanced FR-4" type PCB. The PCB is then attached to a heat exchanger via with multiple screws or via adhesive. When screws are used, a thermal interface material (e.g., silicone grease, thermal pad, graphite sheet) is typically placed between the PCB and the heat exchanger. The thermal interface material must be compressed with sufficient force to adequately conduct thermal energy away from the solid-state light sources. The screws must be positioned close to the solid-state light sources to assert a high force in order to achieve the high degree of intimate contact required to provide a suitable level of thermal conduction. The large number of solid-state light sources required to achieve a desired level of illumination means that a large number of screws are typically required to fasten the PCB tightly enough to the heat exchanger to obtain the desired level of thermal conduction. For example, one commercially available lamp having 12 Cree XPG LEDs mounted on a metal core PCB employs 35 screw fasteners to couple the metal core PCB to the heat exchanger.

As noted, the PCB may be physically coupled to the heat exchanger via an adhesive. Such an approach suffers from a number of drawbacks: For example, typical adhesives do not provide as high a thermal conductivity as compared to liquid silicone thermal interface materials or thermal interface pads made of silicone or graphite. Also, adhesive attachment of the PCB to the heat exchanger is permanent. Consequently, it is imperative that the PCB is correctly positioned the first time it is applied to the heat exchanger. Also, adhesives are typically not electrically insulating, unlike silicone thermal pads. Thus, the heat exchanger is not electrically isolated from the PCB. Electrical isolation is desirable in many designs to protect a user from electrical shock. Additionally, the PCB is not easily removable for servicing or replacement if one or more LEDs is damaged, out of specification or fails.

A new approach to providing heat transfer from solid-state light sources is desirable.

BRIEF SUMMARY

A lighting device may be summarized as including a heat exchanger; at least a first circuit board including a number of electrically insulative layers and a number of electrically conductive paths, the first circuit board having a longitudinal dimension and a lateral dimension, a first major outer face, and a second major outer face, the first and the second major outer faces on opposite sides of the first circuit board from one another, at least one thickness of the first circuit board defined between the first and the second major outer faces; and at least two solid state light emitters carried by the first circuit board and electrically coupled to the electrically conductive paths of the first circuit board, wherein at least the first circuit board is physically coupled to the heat exchanger such that the first circuit board is curved along at least one of a longitudinal dimension or a lateral dimension thereof.

The first circuit board may be a flexible printed circuit board. The first circuit board may have a number of kerfs and a number of flats between respective pairs of the kerfs, the solid state light emitters coupled to the flats between the kerfs. The first circuit board may be curved along both of the longitudinal dimension and the lateral dimension thereof.

The lighting device may further include a thermally conductive interface material positioned between at least a portion of the second major outer face of the circuit board and a portion of the heat exchanger. The lighting device may further include a number of selectively removable fasteners that physically couple the first circuit board to the heat skin, the fasteners electrically insulated from the heat exchanger. The lighting device may further include a number of cam fasteners configured to apply a tension force to the first circuit board when fastened. The lighting device may further include a number of cam fasteners configured to apply a compressive force to the first circuit board when fastened.

The heat exchanger may have a heat dissipation surface including a plurality of fins and a circuit board mounting surface, the circuit board mounting surface proximate the first circuit board relative to the heat dissipation surface, at least the circuit board mounting surface of the heat exchanger being curved along at least one of a longitudinal dimension or a lateral dimension thereof. The circuit board mounting surface of the heat exchanger may be convex along at least one of the longitudinal dimension or lateral dimension thereof. The circuit board mounting surface of the heat exchanger may be concave along at least one of the longitudinal dimension or lateral dimension thereof. The heat exchanger may have a heat dissipation surface and a circuit board mounting surface, the circuit board mounting surface proximately adjacent the second major outer surface of the first circuit board, at least the second major out surface curved along at least one of the longitudinal dimension or the lateral dimension before the first circuit board is physically coupled to the heat exchanger.

The lighting device may further include a shim received between the heat exchanger and the first circuit board, the shim having at least one surface that is curved along at least one of a longitudinal dimension or a lateral dimension thereof before the shim is received between the heat exchanger and the first circuit board. The first circuit board may be an elongated strip with a first end and a second end, a respective portion of the first and the second ends in an overlap relationship, and further including a single fastener received through the overlapped portions of the first and the second ends to physically couple the first circuit board to the heat skin. The lighting device may further include a peripheral clamp that secures the first circuit board to the heat exchanger about of periphery of the first circuit board. The peripheral clamp may include a cover that is at least translucent to at least some wavelengths of light emitted by the solid state light emitters. The lighting device may further include an electronic ballast electrically coupled to the solid state light emitters via the electrically conductive paths of the first circuit board; a cover that is at least translucent to at least some wavelengths of light emitted by the solid state light emitters; and a reflector positioned to reflect light emitted by the solid state light emitters towards the cover.

A lighting device may be summarized as including a heat exchanger having a circuit board mounting face having a longitudinal dimension and a lateral dimension and a plurality of fins, the circuit board mounting face being curved along at least one of the longitudinal dimension or the lateral dimension thereof; at least one circuit board having a number of kerfs and a number of flats separate by the kerfs, the circuit board having a longitudinal dimension and a lateral dimension; at least two solid state light emitters carried by the circuit board positioned at the flats between the kerfs; and at least one fastener that removably physically couples the circuit board to the heat exchanger under at least one of a tensile or a compressive force such that the first circuit board is curved along at least one of the longitudinal dimension or the lateral dimension of the circuit board when the circuit board is physically coupled to the heat exchanger by the at least one fastener.

The at least one fastener may be electrically insulated from the heat exchanger, and may further include a thermally conductive interface material positioned between at least a portion of the second major outer face of the circuit board and a portion of the heat exchanger. The at least one fastener may be a cam fastener that applies at least one of an additional tensile force or an additional compressive force to the circuit board when the circuit board is physically coupled to the heat exchanger by the at least one cam fastener. The at least one fastener may include a peripheral clamp that secures the circuit board to the heat exchanger about of periphery of the circuit board.

A method of constructing a lighting device may be summarized as including providing a heat exchanger having a circuit board mounting face having a longitudinal dimension and a lateral dimension and a plurality of fins, the circuit board mounting face being curved along at least one of the longitudinal dimension or the lateral dimension thereof; providing at least one circuit board having a number of kerfs and a number of flats separate by the kerfs, the circuit board having a longitudinal dimension and a lateral dimension, the circuit board carrying at least two solid state light emitters positioned at the flats between the kerfs; and removably physically coupling the circuit board to the heat exchanger under at least one of a tensile or a compressive force with at least one fastener such that the first circuit board is curved along at least one of the longitudinal dimension or the lateral dimension of the circuit board when the circuit board is physically coupled to the heat exchanger by the at least one fastener.

Removably physically coupling the circuit board to the heat with at least one fastener may include removably physically coupling the circuit board to the heat with a single fastener. Removably physically coupling the circuit board to the heat with at least one fastener may include removably physically coupling the circuit board to the heat with a cam fastener that applies at least one of an additional tensile force or an additional compressive force to the circuit board when the circuit board is physically coupled to the heat exchanger by the at least one cam fastener. Removably physically coupling the circuit board to the heat with at least one fastener may include removably physically coupling the circuit board to the heat with a peripheral clamp.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with lighting fixtures, power supplies and/or power system for lighting have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings and Abstract of the Disclosure provided herein are for convenience only and do not interpret the scope or meaning of the embodiments.

Figure 1A:
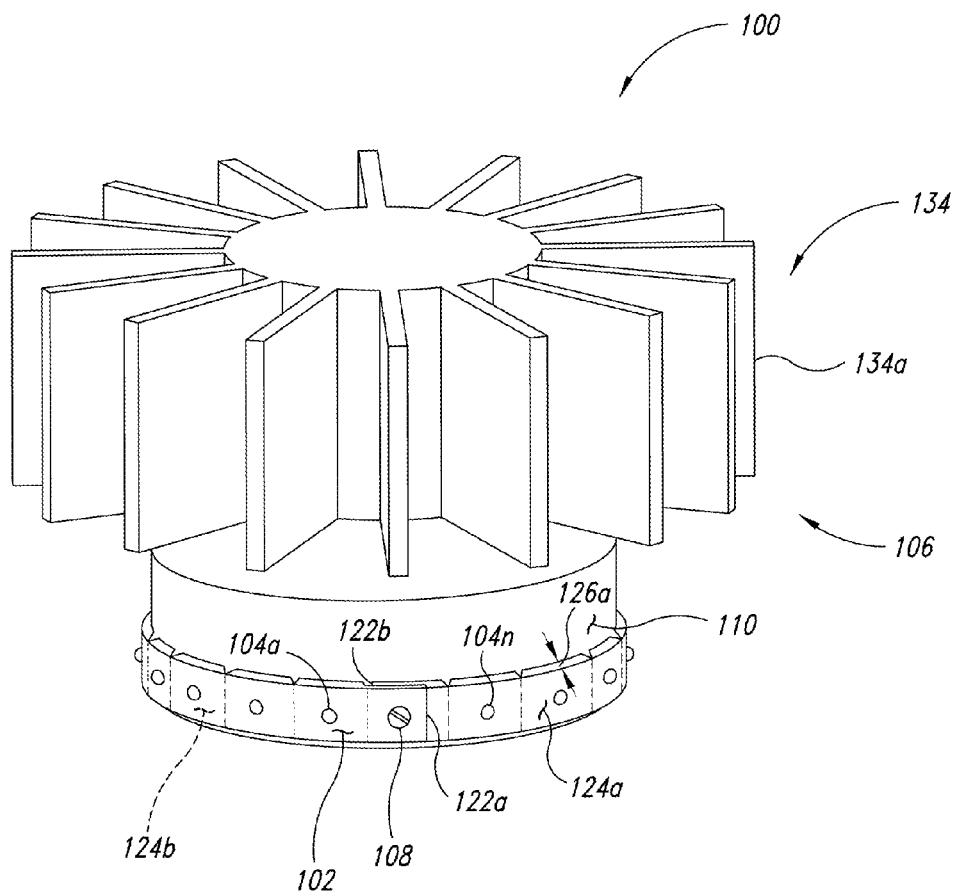
FIG. 1A is an isometric view of a lighting device according to one non-limiting illustrated embodiment, including a circuit board that carries a linear (one-dimensional) array of solid-state light sources, physically coupled to a convex portion of a heat exchanger via fasteners, for instance a single fastener.

FIG. 1A shows a lighting device 100 according to one non-limiting illustrated embodiment.

The lighting device 100 includes at least one circuit board 102, a number of solid-state light sources 104a-104n (only two called out, collectively 104), a heat exchanger 106, and one or more fasteners 108. The circuit board 102 carries the solid-state light sources 104. The circuit board 102 is physically coupled to a curved circuit board mounting surface or portion 110 of a heat exchanger 106 via the fasteners 108 such that the circuit board 102 is curved and under a tensile force when coupled to the heat exchanger 106.

Figure 1B:
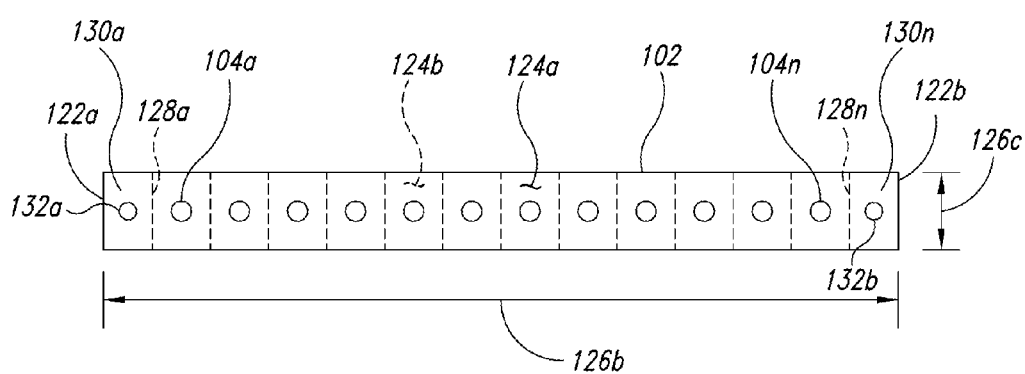
FIG. 1B is a top plan view of the circuit board and linear array of solid-state light sources of FIG. 1A, prior to being physically coupled to a convex portion of a heat exchanger via fasteners.

FIG. 1B shows the circuit board 102 and linear array of solid-state light sources 104 of FIG. 1A, prior to being physically coupled to a convex portion 110 of a heat exchanger 106 via fasteners 108. The circuit board 102 is generally flat or planar, at least when supported. Notably, the circuit board 102 may sag under the influence of gravity when not supported.

With reference to FIGS. 1A and 1B, the circuit board 102 may include one or more layers of an electrically insulative or dielectric material. Common materials include FR2, FR3, FR4, aluminum core (ThermaCore, Inc.; Bregquist, Inc.). The circuit board 102 may include one or more electrically conductive paths (not shown in FIG. 1A) carried on one or more layers, or through one or more layers by vias. Electrically conductive paths may, for example, take the form of one or more traces of electrically conductive material. The circuit board 102 may take the form of a printed circuit board.

In the illustrated embodiment, the circuit board 102 takes the form of an elongated strip with a first end 122a and a second end 122b opposed to the first end 112a. As best illustrated in FIG. 1B, the circuit board 102 has a first major outer face 124a and a second major outer face 124b, the second major outer face 124b opposed across a thickness 126 of the circuit board 102 from the first major outer face 124a. As used herein, major outer face refers to an outer surface of the circuit board 102 with dimensions substantially greater than a dimension of what would commonly be denominated as the thickness by those of skill in the art. While illustrated as having a plan shape that is rectangular, the circuit board 102 may take any other shape. The circuit board 102 has a longitudinal dimension 126b and lateral dimension 126c, generally perpendicular to the longitudinal dimension 126b. The thickness 126a of the circuit board 102 is generally orthogonal to the longitudinal 126b and lateral dimensions 126c at any given point. A dimension of the thickness 126a may vary along the longitudinal and/or lateral dimensions 126b, 126c of the circuit board 102.

As illustrated in FIGS. 1A and 1B, the circuit board 102 may include a number of kerfs 128a-128n (only two called out, collectively 128). The kerfs 128 may extend part way through the thickness 126a of the circuit board 102. The kerfs 128 may be V-shaped, square or rectangular, or any other shaped which provides flexure joints. The kerfs or flexure joints make the circuit board sufficiently flexible (e.g., small number of layers) as to conform to a curved surface when a force is applied, without breaking or cracking. Yet, the circuit board 102 is sufficiently rigid that a tensile stress develops in the circuit board 102 when pressed onto a curve surface.

The circuit board 102 may include a number of flats 130a-130n (only two called out, collectively 130) positioned one either side of the kerfs 128, for example between respective pairs of kerfs 128. The kerfs 128 and flats 130 create a polygonal shape when the circuit board 102 is wrapped or curved around or about a curved surface, such as a convex or concave surface. Alternatively, or additionally, the circuit board 102 may be a flexible circuit board. That is the circuit board may be sufficiently flexible (e.g., small number of layers) as to conform to a curved surface when a force is applied, without breaking or cracking. However, even when the circuit board 102 is flexible, it is sufficiently stiff such that it will not drape around a curved surface simply under the influence of gravity. The circuit board 102 may also include one or more apertures, such as one or more through holes 132a, 132b (collectively 132), best illustrated in FIG. 1B, sized to receive fasteners 108.

The solid-state light sources 104 may take a variety of forms. For example, the solid-state light sources 104 may take the form of discrete LEDs, OLEDs, PLEDs or any other solid-state light source. The solid-state light sources 104 may be arranged along the longitudinal dimension 126b of the circuit board 102. The solid-state light sources 104 may, for example, be arranged in a linear or one-dimensional array. The solid-state light sources 104 may be electrically coupled to conductive paths of the circuit board 102 or carried thereby.

The heat exchanger 106 may take a variety of forms suitable for transferring heat from a solid (e.g., solid-state light sources 104) to a fluid (i.e., gas or liquid). The heat exchanger 106 may be a passive device, for example, take the form of a heat sink, heat spreader and/or heat pipe that employs a phase change of a heat exchange fluid (e.g., liquid/vapor). For example, an IVC heat spreader from PyroS Corporation, with thermal conductivity of at least 10,000 W/mK may be employed. The heat exchanger 106 may have a dissipation portion 134 which typically includes a relatively large surface area, allowing dissipation of heat therefrom to a fluid (e.g., ambient environment) by convective and/or radiant heat transfer. The dissipation portion 134 may, for example, include one or more protrusions 134a (only one called out). In some embodiments, the protrusions may take the form of fins or pin fins. The heat exchanger 106 may comprise a metal (e.g., aluminum, aluminum alloy, copper, copper alloy) or other high thermal conductivity material. The heat exchanger 106 may, for example, have a thermal conductivity of at least 150 Watt per meter Kelvin (W/mK).

In the embodiment illustrated in FIG. 1A, the curved portion 110 of the heat exchanger 106 is convex about a single axis. In other embodiments, the curved portion 110 may be convex about two axes (i.e., doubly convex) or may be concave about one or two axes.

The circuit board 102 is advantageously physically coupled to the curved portion 110 of the heat exchanger 106. Notably, while the flexures or kerfs 128 allow the circuit board 102 to conform to some degree to the curved surface or portion 110 of the heat exchanger 106, the physical coupling of the circuit board 102 to or about the curved portion 110 of the heat exchanger 106 places a force on the circuit board 102. In particular, in the embodiment illustrated in FIG. 1, the physical coupling places the circuit board 102 under tension or tensile force. The tensile force produces a very tight, intimate physical contact between the second major outer face 124b of the circuit board 102 and the curved circuit board mounting surface or portion 110 of the heat exchanger 106. The curved circuit board mounting surface or portion 110 of the heat exchanger 106 is sometimes denominated herein as the circuit board mounting surface since such surface is directly or indirectly adjacent to the circuit board 102 when physically coupled.

As illustrated in FIG. 1, the ends 122a, 112b of the circuit board 102 may overlap. Such may advantageously allow the circuit board 102 to be physically coupled to the heat exchanger 106 with a minimum number of fasteners 108. For example, a single fastener 108 may couple the ends 122a, 122b of the circuit board 102 to the heat exchanger 106. The fasteners 108 may take any of a large variety of forms. For example, the fasteners 108 may take the form of threaded fasteners, for instance various types of screws (e.g., machine screws) or bolts and nuts. Suitable fasteners may include various types of clips or clamps, or any other mechanism (i.e. tool) that can secure the circuit board 102 to the heat exchanger 106. For example, the fastener 108 may take the form of a clamp identical or similar to a hose clamp. Such may be selectively adjusted or tightened to retain the circuit board 102 to the circuit board mounting surface 110 of the heat exchanger 106 by a clamping force or friction. Thus, the fasteners do not necessarily need to threadedly couple the circuit board to the heat sink, but rather can employ any variety of attachment or fastening mechanisms. The fasteners 108 may be metal fasteners or may be plastic or some other materials. Electrically insulative sleeves may be used where metal fasteners 108 are employed to provide electrical isolation. The fasteners 108 are preferably removable. Such advantageously allows the circuit board 102 to be removed from the heat exchanger 106 for replacement or servicing. Such may also allow adjustment to the position of the circuit board 102 on the heat exchanger 106

The lighting device 100 may include additional components, for example a ballast, control circuit, additional circuit boards and/or additional solid-state light sources. Additionally, or alternatively, the lighting device 100 may be integrated or otherwise incorporated into a further structure, for example a luminaire or lamp post.

Figure 2:
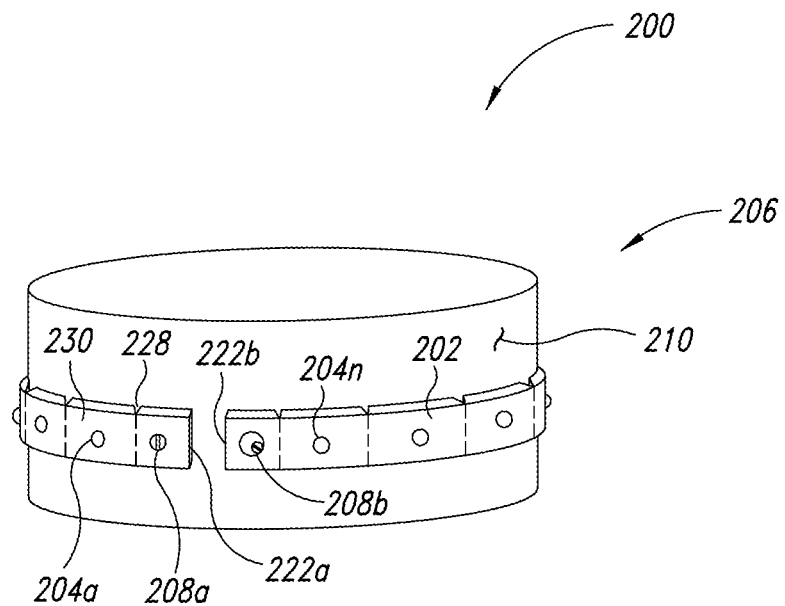
FIG. 2 is a partial isometric view of a lighting device according to another non-limiting illustrated embodiment, including a circuit board that carries a linear array of solid-state light sources, physically coupled to a convex portion of a heat exchanger via fasteners, for instance via two fasteners including at least one cam fastener.

FIG. 2 shows a lighting device 200 according to one non-limiting illustrated embodiment.

The lighting device 200 includes at least one circuit board 202, a number of solid-state light sources 204a-204n (only two called out, collectively 204), a heat exchanger 206, and one or more fasteners 208a, 208b (collectively 208). The circuit board 202 carries the solid-state light sources 204 on flats 230 (only one called out) between kerfs 228 (only one called out), and is physically coupled to a curved surface board mounting surface or portion 210 of a heat exchanger 206 via the fasteners 208.

In contrast to the embodiment of FIGS. 1A and 1B, ends 222a, 222b of the circuit board 202 do not overlap one another in the embodiment of FIG. 2. Thus two fasteners 208 are used. One fastener 208a, may be a standard threaded fastener, for example a standard screw such as a machine screw or a standard bolt and nut. The other fastener 208b may be a cam type fastener. Such may be adjusted, for example by rotation, to tighten the circuit board 202 across the convex circuit board mounting surface 210. Thus, such may allow additional force (e.g., tensile force) to be applied to the circuit board 202, in addition to the tensile force assert by coupling the circuit board 202 to the curved circuit board mounting surface or portion 210. For example, the cam type fastener 208b may have an elliptical portion that rotates about an axis to selectively apply the additional tensile force. Various types of cam type fasteners may be suitable, including those used to put together furniture (e.g., IKEA® furniture). In some embodiments, both ends 222a, 222b may be secured with cam type fasteners, allowing a greater range of adjustment of tensile force to be applied to the circuit board 202.

Figure 3:
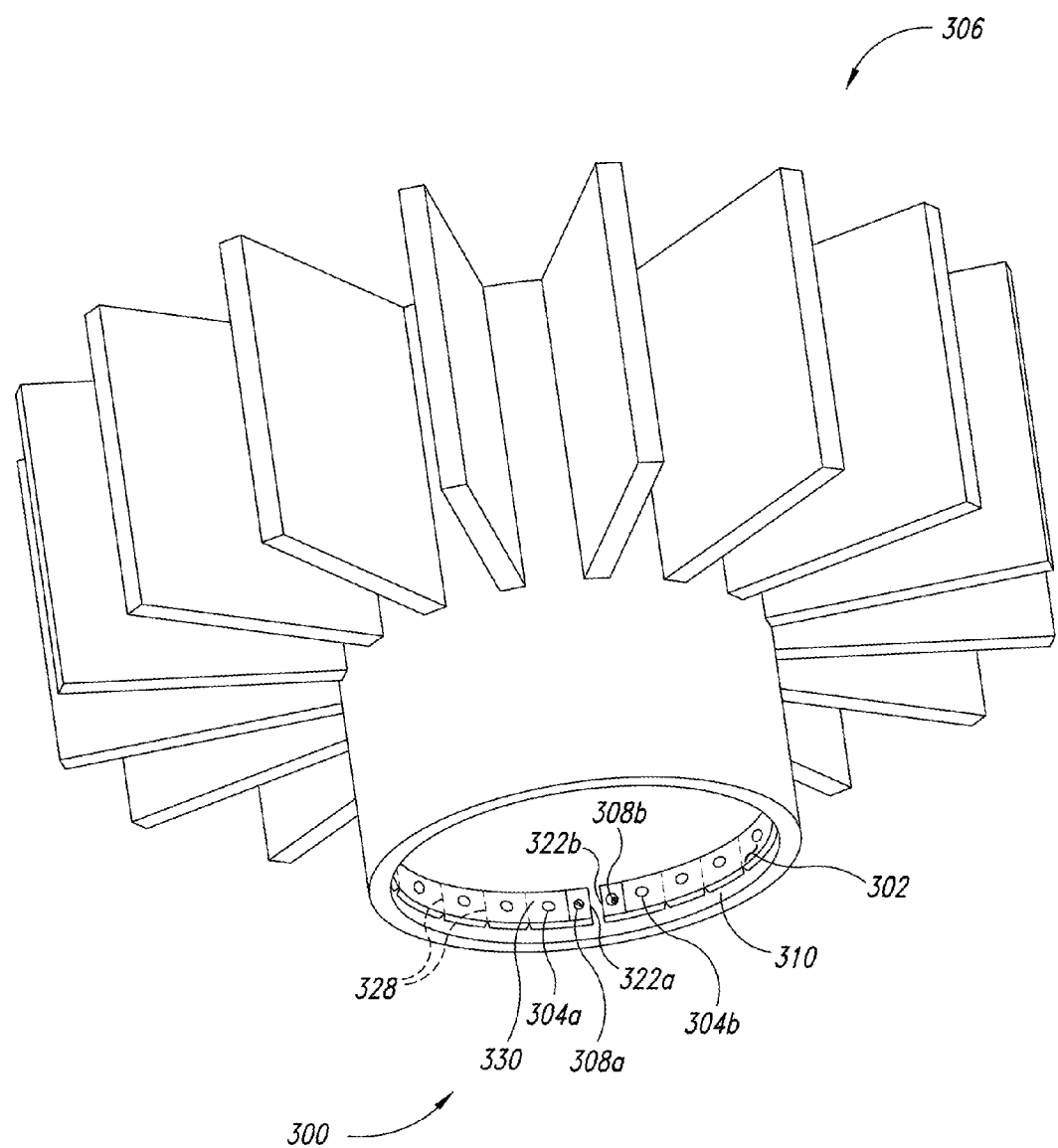
FIG. 3 is an isometric view of a lighting device according to another non-limiting illustrated embodiment, including a circuit board that carries a linear array of solid-state light sources, physically coupled to a concave portion of a heat exchanger via fasteners, for instance two fasteners including at least one cam type fastener.

FIG. 3 shows a lighting device 300 according to another non-limiting illustrated embodiment.

The lighting device 300 includes at least one circuit board 302, a number of solid-state light sources 304a-304n (only two called out, collectively 304), a heat exchanger 306, and one or more fasteners 308a, 308b (collectively 308). The circuit board 302 carries the solid-state light sources 304 on flats 330 (only one called out) between kerfs 328 (only two called out), and is physically coupled to a curved circuit board mounting surface or portion 310 of a heat exchanger 306 via the fasteners 308.

In contrast to the embodiment of FIG. 2, the curved circuit board mounting surface or portion 310 of the heat exchanger 306 is concave. As in the embodiment of FIG. 2, ends 322a, 322b of the circuit board 302 do not overlap one another, thus two fasteners 308 are used. Again one fastener 308a may be a standard threaded fastener, for example a standard screw such as a machine screw or a standard bolt and nut. The other fastener 308b may be a cam type fastener. Such may be adjusted to expand the circuit board 302 into the concave surface. Thus, such may allow additional force (e.g., compressive force) to be applied to the circuit board 302, in addition to the force assert by coupling the circuit board 302 to the curved circuit board mounting surface or portion 310. For example, the cam type fastener 308b may have an elliptical portion that rotates about an axis to selectively apply the additional compressive force. Various types of cam type fasteners may be suitable.

Figure 4:
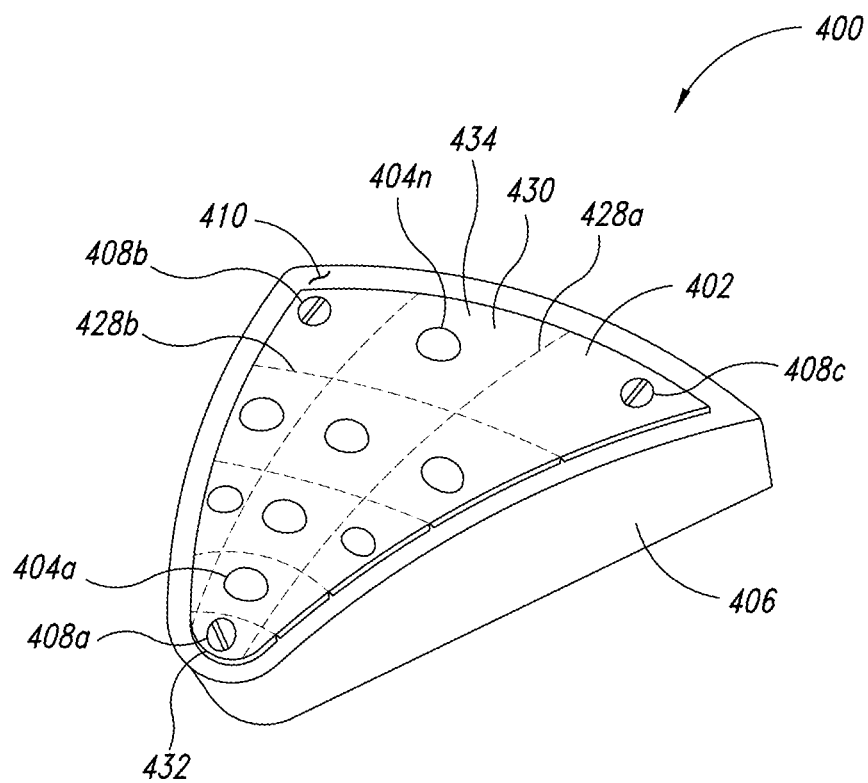
FIG. 4 is a partial isometric view of a lighting device according to another non-limiting illustrated embodiment, including a circuit board that carries a two-dimensional array of solid-state light sources, physically coupled to a convex portion of a heat exchanger via fasteners, for instance via three fasteners.

FIG. 4 shows a portion of a lighting device 400 according to another non-limiting illustrated embodiment.

The lighting device 400 includes at least one circuit board 402 that carries a number of solid-state light sources 404a-404n (only two called out, collectively 404), which is physically coupled to a heat exchanger 406 by one or more fasteners 408a-408c (collectively 408). The circuit board 402 carries the solid-state light sources 404 on flats 430 (only one called out) between kerfs 428a, 428b (only two called out, collectively 428), and is physically coupled to a curved circuit board mounting surface or portion 410 of a heat exchanger 406 via the fasteners 408.

In contrast to the previously illustrated embodiments, the light sources 404 are arranged in a two dimensional array on the circuit board. The circuit board 402 has a plan shape that is a wedge. Also in contrast to the previously illustrated embodiments, the heat exchanger 406 of the embodiment of FIG. 4 is curved along radial dimensions extending from a point 432 of the circuit board to a peripheral edge 434 thereof, as well as a lateral dimension generally perpendicular to the radial dimensions. To accommodate the complex or double curvature, the circuit board 402 has kerfs 428a extending in the radial dimension and kerfs 428b extending in the lateral dimension to create flats 430, which kerfs 428 intersect at various points.

While fasteners 408 are illustrated as standard threaded fasteners, one or more cam type fasteners may be employed.

Figure 5:
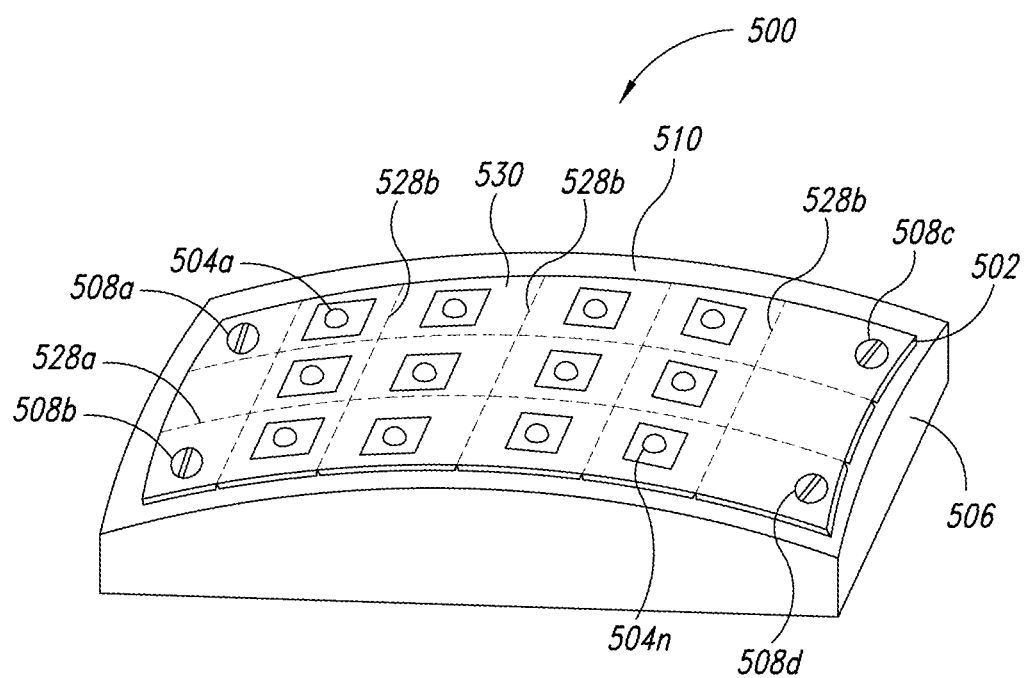
FIG. 5 is a partial isometric view of a lighting device according to another non-limiting illustrated embodiment, including a circuit board that carries a two-dimensional array of solid-state light sources, physically coupled to a doubly convex portion of a heat exchanger via fasteners, for instance via four fasteners.

FIG. 5 shows a portion of a lighting device 500 according to another non-limiting illustrated embodiment.

The lighting device 500 includes at least one circuit board 502, a number of solid-state light sources 504a-504n (only two called out, collectively 504), and one or more fasteners 508a-508d (collectively 508), for example four fasteners 508. The circuit board 502 carries the solid-state light sources 504 on flats 530 (only one called out) between kerfs 528a, 528b (only two called out, collectively 528), and is physically coupled to a curved circuit board mounting surface or portion 510 of a heat exchanger 506 via the fasteners 508.

In contrast to the embodiments of FIGS. 1A, 1B, 2 and 3, the light sources 504 are arranged in a two dimensional array on the circuit board 502. The circuit board 502 has a plan shape that is a rectangular. Also in contrast to the those illustrated embodiments, the heat exchanger 506 of the embodiment of FIG. 4 has a circuit board mounting surface 510 that is curved along both longitudinal and lateral dimensions. To accommodate the complex or double curvature, the circuit board 502 has kerfs 528a extending in the longitudinal and dimension and kerfs 528b lateral dimensions to create flats 530, which kerfs 528 intersect at various points.

While fasteners 508 are illustrated as standard threaded fasteners, one or more cam type fasteners may be employed.

Figure 6:
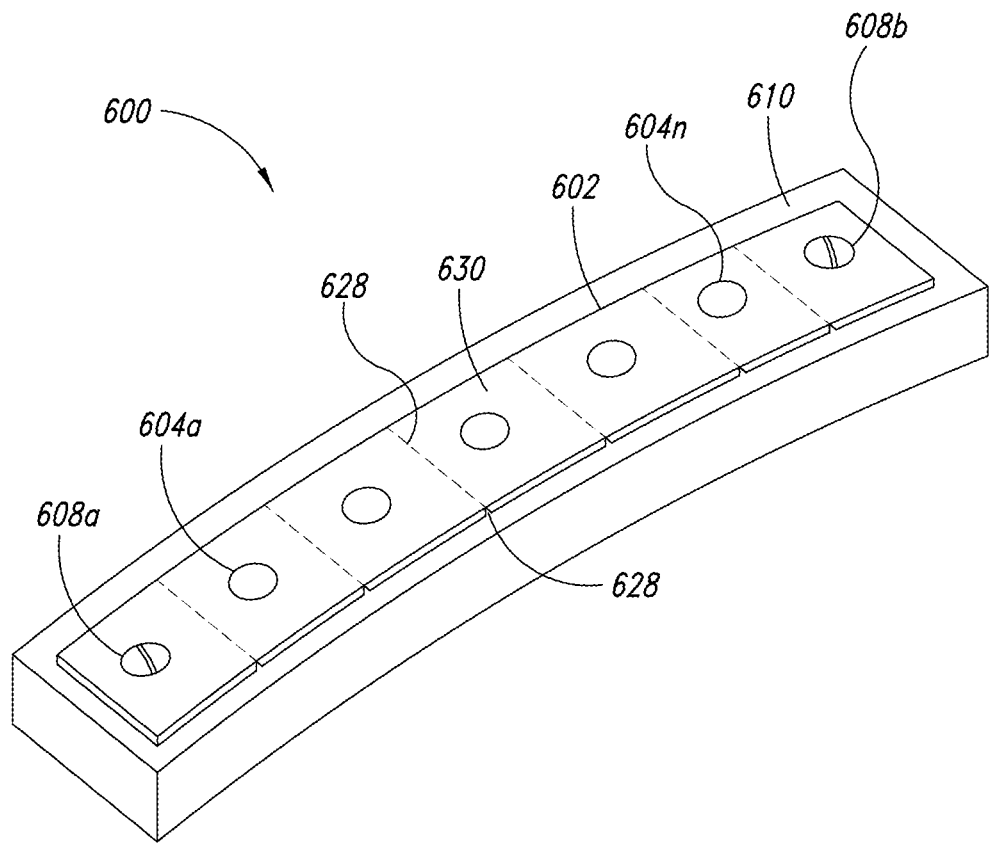
FIG. 6 is a partial isometric view of a lighting device according to another non-limiting illustrated embodiment, including a circuit board that carries a linear array of solid-state light sources, physically coupled to a convex portion of a heat exchanger via fasteners, for instance via two fasteners.

FIG. 6 shows a portion of a lighting device 600 according to another non-limiting illustrated embodiment.

The lighting device 600 includes at least one circuit board 602, a number of solid-state light sources 604a-604n (only two called out, collectively 604), and one or more fasteners 608a, 608b (collectively 608). The circuit board 602 carries the solid-state light sources 604 on flats 630 (only one called out) between kerfs 628 (only two called out), and is physically coupled to a curved circuit board mounting surface or portion 610 of a heat exchanger 606 via the fasteners 608, for instance only two fasteners.

Figure 7A:
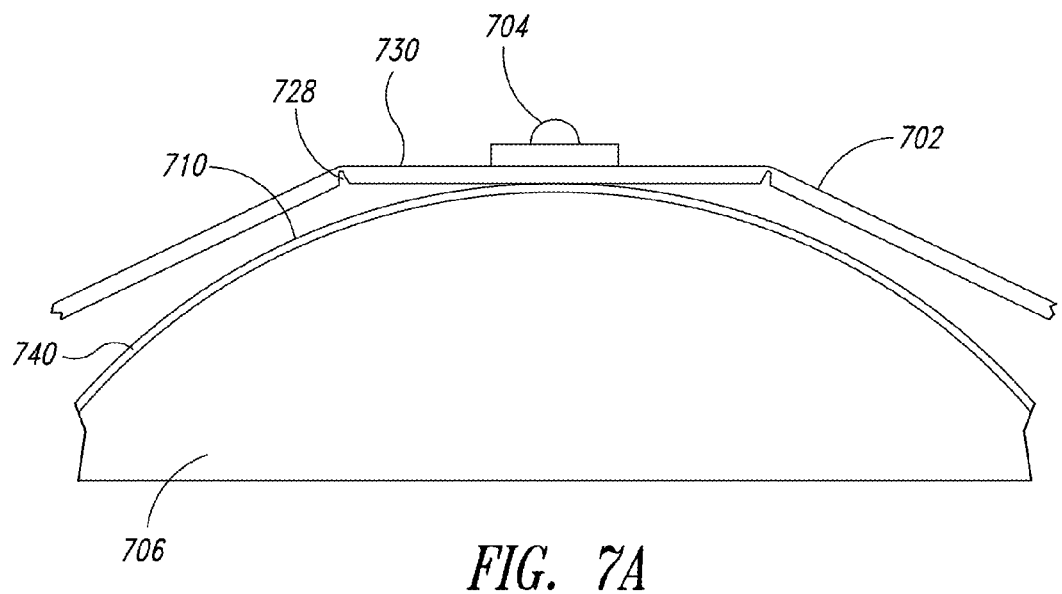
FIG. 7A is a partial side elevational view of a circuit board carrying a number of solid-state light sources, the circuit board positioned with respect to a heat exchanger to be physically and thermally conductively coupled thereto, and a thermal transfer interface material positioned therebetween, according to another non-limiting illustrated embodiment.

FIG. 7A shows a portion of a circuit board 702 which carries solid-state light sources 704 (only one illustrated) while being positioned on a circuit board mounting surface 710 of a heat exchanger 706 with a thermal transfer interface material 740 positioned therebetween, according to another non-limiting illustrated embodiment.

Kerf 728 and flats 730 are clearly illustrated in FIG. 7A, as is the relationship of the circuit board 702 to the circuit board mounting surface 710 prior to physical coupling of the circuit board 702 thereto. The thermal transfer interface material 740 may take a variety of forms having a high thermal transfer value. For example, liquid silicone thermal interface materials or thermal interface pads made of silicone or graphite may be suitable.

Figure 7B:
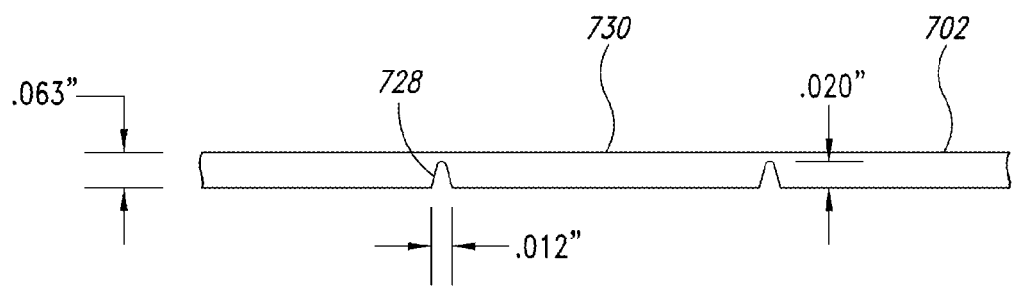
FIG. 7B is a partial side elevational view of a portion of the circuit board of FIG. 7A showing some exemplary dimensions, according to another non-limiting illustrated embodiment.

FIG. 7B shows an enlarged portion of the circuit board of FIG. 7A, illustrating some suitable dimensions.

Notably, the circuit board 702 may, for example, have a thickness of approximately 0.063 inches. For such a thickness, kerfs 728 may have a depth of approximately 0.020 inches. Kerfs 728 may have a width of approximately 0.012 inches. A longitude of the kerf 728 may run perpendicular to a dimension of curvature of the circuit board mounting surface 710 of the heat exchanger 706.

Figure 8:
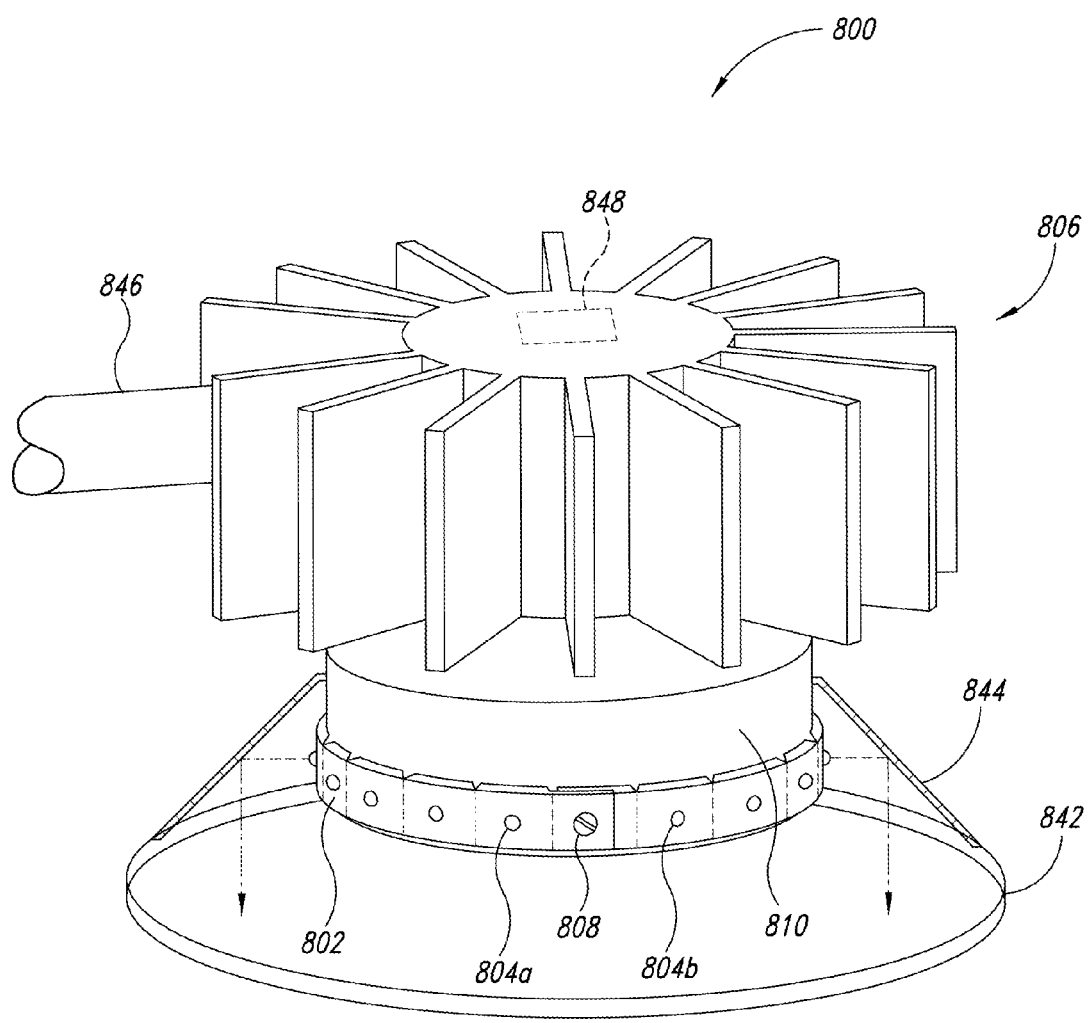
FIG. 8 is a partial isometric view of a lighting device and a pole according to another non-limiting illustrated embodiment, including a circuit board that carries a linear (one-dimensional) array of solid-state light sources, physically coupled to a convex portion of a heat exchanger via fasteners, a weather tight cover to provide environmental protection to the solid-state light sources, a reflector to reflect light toward the cover, and a portion of the pole to which the lighting device is mounted or mountable.

FIG. 8 shows a lighting device 800 according to another illustrated embodiment.

The lighting device 800 is similar to that of FIG. 1A, and may include at least one circuit board 802, a number of solid-state light sources 804a-804n (only two called out, collectively 804), a heat exchanger 806, and one or more fasteners 808. The circuit board 802 carries the solid-state light sources 804, and is physically coupled to a curved convex circuit board mounting surface or portion 810 of the heat exchanger 806 via the fasteners 808.

The lighting device 800 may also include an optical cover 842 that provides environmental protection to the solid-state light sources 804, circuit board 802 and/or other components. The cover 842 is at least translucent to at least some wavelengths of light, for instance some wavelengths in the visible portion of the electromagnetic spectrum. In some embodiments, the cover 842 may be completely transparent. The cover 842 may be comprised of any of a large variety of materials suitable for providing environmental protection, for example, glass, or a plastic such as an acrylic plastic. The cover 842 may take the form of a lens for focusing light in any desired pattern or for dispersing light. For example, the cover 842 may produce an illumination pattern such as a NEMA designated "butterfly" pattern that evenly distributes the light emitted by the light sources 804 over a large area on the ground.

The lighting device 800 may also include one or more reflectors 844 positioned and/or oriented to reflect light from the solid-state light sources toward the cover. The reflector(s) 844 may take any of a large variety of forms, for example a mirrored surface, polished surface, or a retro-reflector. As illustrated, the reflector 844 may take the form of an interior surface of a cone or frustro-conical structure.

The cover 842 may be removably physically coupled to the reflector 844 or some other portion of the lighting device 800. Alternatively, the cover 842 may be permanently fixed to the reflector 844 or some other portion of the lighting device 800. The cover 842 be physically coupled to the reflector 844 or some other portion of the lighting device 800 by any of a large variety of fastener mechanisms, for example threaded fasteners, detents, latches, rivets, clips, snaps tabs, or adhesives (not shown). The optical cover plate 842 may act as a weather seal to exclude moisture and other contamination elements from the solid-state light source 804. Alternatively, a weather seal may be provided between the optical cover plate 842 and the heat exchanger 806.

The lighting device 800 may further include, or may be physically coupled to, a pole or other support 846 to support the lighting device 800 above a surface, for instance the ground. The pole or support 846 may, for example, be part of a light pole or other structure commonly found along streets and roads.

The lighting device 800 may additionally, or alternatively, include circuitry to control the solid-state light sources 804. For example, the lighting device 800 may include an electronic ballast (electronic lamp ballast) 848. The electronic ballast 848 may be coupled to receive AC power, such as from AC power mains. The electronic ballast 848 regulates the received AC power to provide the regulated power to the solid-state light source 804. Alternatively, the electronic ballast 848 includes electronics to receive DC power, such as from one or more batteries, to provide to the solid-state light source 804. The electronic ballast 848 may, for example, be configured to receive power from a photovoltaic power source, a wind power source, or another alternative energy source. Wiring for the electronic ballast 848 to receive power and wirings between the electronic ballast 848 and the solid-state light source 804 are not shown in order to avoid obscuring the illustrated embodiments.

The light device 800 may include a control subsystem (not shown). The control subsystem may include one or more discrete electrical or electronic components (e.g., electronic ballast, capacitors, resistors, transistor, triac) and/or one or more integrated components (e.g., microcontroller, application specific, integrated circuit, microprocessor). The control subsystem may include analog and/or digital components. The control subsystem may include one or more sensors (e.g., light level sensor, motion sensor), and be configured to control the solid-state light emitters according to information or signals produced by the sensors. For example, the control subsystem may implement a dusk-dawn operation based on detected levels of illumination. Also for example, the control subsystem may implement a motion detecting functionality based on detection of motion or a presence/absence condition. Various options are discussed in commonly assigned U.S. patent application Serial Nos. U.S. patent application Ser. No. 12/619,535 filed Nov. 16, 2009; Ser. No. 12/784,091 filed May 20, 2010; and U.S. patent application Ser. No. 12/784,093 filed May 20, 2010. Components of the control subsystem may be carried by the circuit board, or by one or more additional circuit boards.

While illustrated without a housing that is distinct from the heat exchanger 806, some embodiment may employ a distinct housing. Such embodiments should provide adequate exposure of the heat dissipation portion of the heat exchanger 806 to the external environment.

Figure 9:
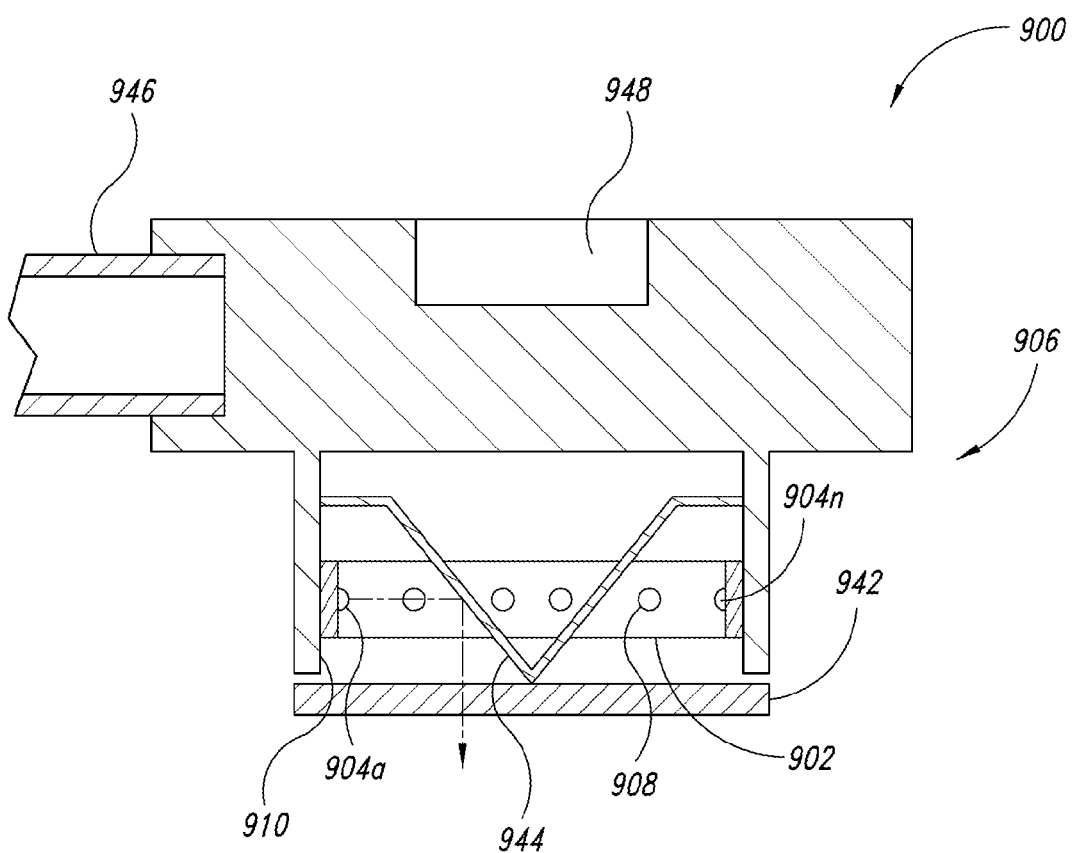
FIG. 9 is a partial isometric view of a lighting device and a pole according to another non-limiting illustrated embodiment, including a circuit board that carries a linear (one-dimensional) array of solid-state light sources, physically coupled to a concave portion of a heat exchanger via fasteners, an electronic ballast, a weather tight cover to provide environmental protection to the solid-state light sources, a reflector to reflect light toward the cover, and a portion of the pole to which the lighting device is mounted or mountable.

FIG. 9 shows a lighting device 900 according to another illustrated embodiment.

The lighting device 900 is similar to that of FIG. 3, and may include at least one circuit board 902, a number of solid-state light sources 904a-904n (only two called out, collectively 904), a heat exchanger 906, and one or more fasteners 908. The circuit board 902 carries the solid-state light sources 904, and is physically coupled to a curved concave circuit board mounting surface or portion 910 of a heat exchanger 906 via the fasteners 908.

The lighting device 900 may also include a cover 942 that provides environmental protection to the solid-state light sources 904, circuit board 902 and/or other components. As previously noted, the cover 942 is at least translucent to at least some wavelengths of light and may even be completely transparent. The cover 942 may be comprised of any of a large variety of suitable materials, and may take the form of a lens for focusing or dispersing light.

The lighting device 900 may also include one or more reflectors 944 positioned and/or oriented to reflect light from the solid-state light sources toward the cover 942. The reflector(s) 944 may take any of a large variety of forms, for example a mirrored surface, polished surface, or a retro-reflector. As illustrated, the reflector 944 may take the form of an exterior surface of an inverted cone or frustro-conical structure.

The cover 942 may be removably physically coupled to the heat exchanger 906 or some other portion of the lighting device 900. Alternatively, the cover 942 may be permanently fixed to the heat exchanger 906 or some other portion of the lighting device 900. The cover 942 be physically coupled to the heat exchanger 906 or some other portion of the lighting device 900 by any of a large variety of fastener mechanisms, for example threaded fasteners, detents, latches, rivets (not illustrated).

The lighting device 900 may further include, or may be physically coupled to, a pole or other support 946 to support the lighting device above a surface, for instance the ground.

As previously noted, the lighting device 900 may additionally, or alternatively, include circuitry to control the solid-state light sources. For example, the lighting device 900 may include an electronic ballast (electronic lamp ballast) 948 and/or a control subsystem (not show), similar or identical to that described in reference to FIG. 8 above.

While illustrated without a housing that is distinct from the heat exchanger 906, some embodiment may employ a distinct housing. Such embodiments should provide adequate exposure of the heat dissipation portion of the heat exchanger 906 to the external environment.

Figure 10:
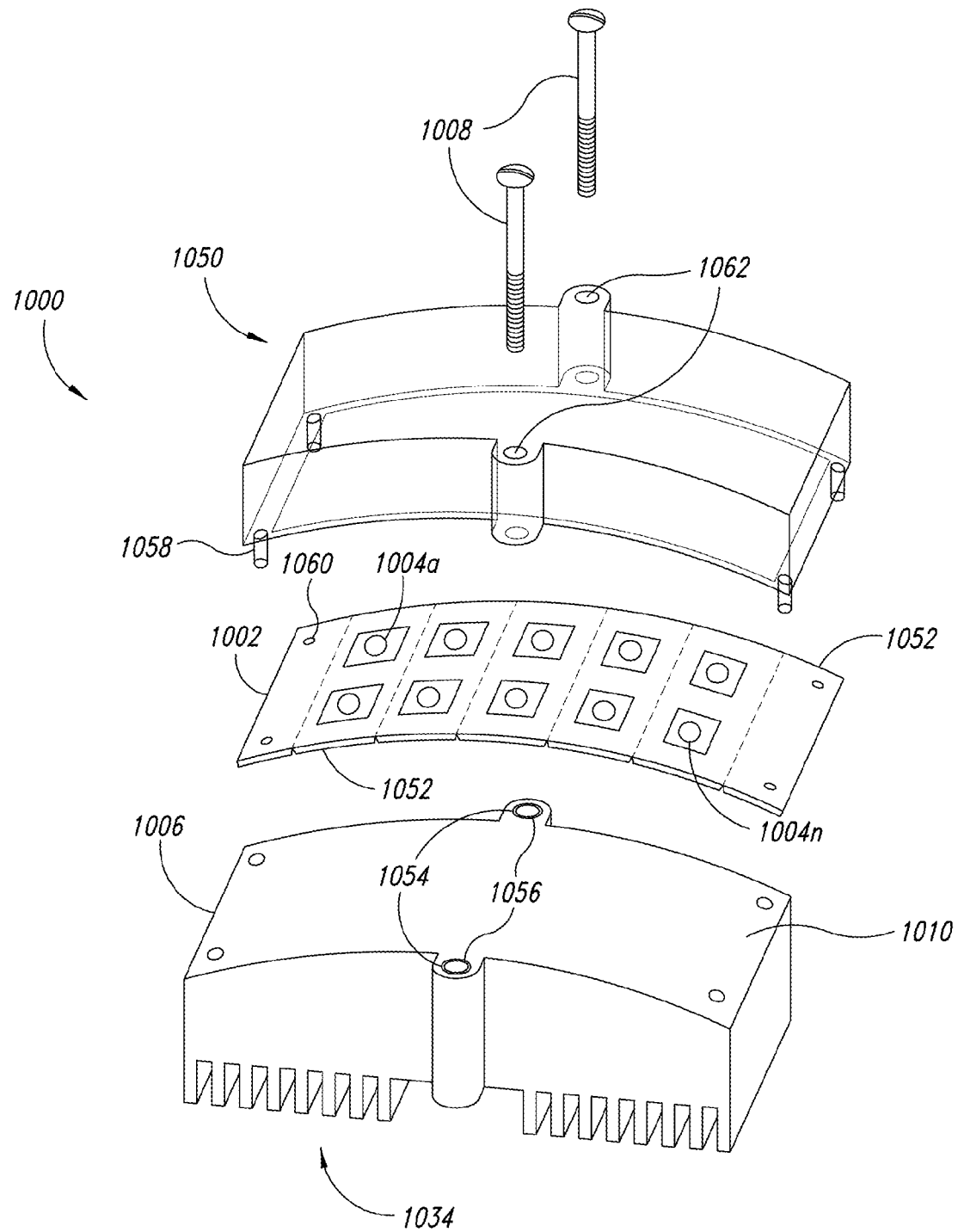
FIG. 10 is an exploded isometric view of a lighting device according to another non-limiting illustrated embodiment, including a circuit board that carries a two-dimensional array of solid-state light sources, physically coupled to a convex portion of a heat exchanger via a peripheral clamp that includes a cover that is at least translucent.

FIG. 10 shows a lighting device 1000 according to another illustrated embodiment.

The lighting device 1000 may include at least one circuit board 1002, a number of solid-state light sources 1004a-1004n (only two called out, collectively 1004) and a heat exchanger 1006. The circuit board 1002 carries the solid-state light sources 804, and is physically coupled to a curved concave circuit board mounting surface or portion 1010 of a heat exchanger 1006 via a clamp, in particular a peripheral clamp 1050. As in the other embodiments, the heat exchanger 1006 may have a heat dissipation portion including fins 1034.

The peripheral clamp 1050 clamps the circuit board 1002 to the circuit board mounting surface 1010 of the heat exchanger 1006 along a peripheral edge 1052 of the circuit board 1002. In particular, one or more threaded fasteners 1008 may secure the peripheral clamp 1050 to the heat exchanger 1006. The heat exchanger 1006 may have threaded holes or apertures 1054 sized and dimensioned to received the threaded fasteners 1008. The peripheral clamp 1050 may likewise have holes or apertures 1062 sized and dimensioned to received the threaded fasteners 1008. Some embodiments may employ electrically non-conductive threaded fasteners 1008, for example plastic screws, to provide electrical insulation between the heat exchanger 1006, and the circuit board 1002, and an exterior of the lighting device 1000. Some embodiments may employ electrically non-conductive threaded sleeves 1056 in the holes or apertures 1054 to provide for the electrical isolation. The circuit board 1002 may be retained to the peripheral clamp 1050 via tabs 1058 (only one called out) and slots 1060 (only one called out) or some other coupler. Alternatively, or additionally, the circuit board 1002 may simply be secured to the circuit board mounting surface 1010 of the heat exchanger 1006 through compressive force applied to the circuit board 1002 by the opposed peripheral clamp 1050 and heat exchanger 1006. As illustrated, it is possible to use only two fasteners 1008 to secure the clamp 1050 to the heat exchanger 1006, and hence the circuit board 1002 to the heat exchanger 1006.

In the illustrated embodiment, the peripheral clamp 1050 takes the form of a cover. As noted above, the cover may provide environmental protection and is translucent or transparent to at least some wavelengths of light. The cover may form a lens and may focus or disperse light. As illustrated the cover may be curved or have a curved surface. Alternatively, the peripheral clamp 1050 may take the form of a bezel or other structure that only attaches around, or at portions of the peripheral edge 1052 without extending across the entire circuit board 1002.

The illustrated heat exchanger 1006 is different from previous heat exchangers. In particular, heat dissipation portion of the heat exchanger 1006 employs a different fin geometry than the previously illustrated embodiments.

Figure 11:
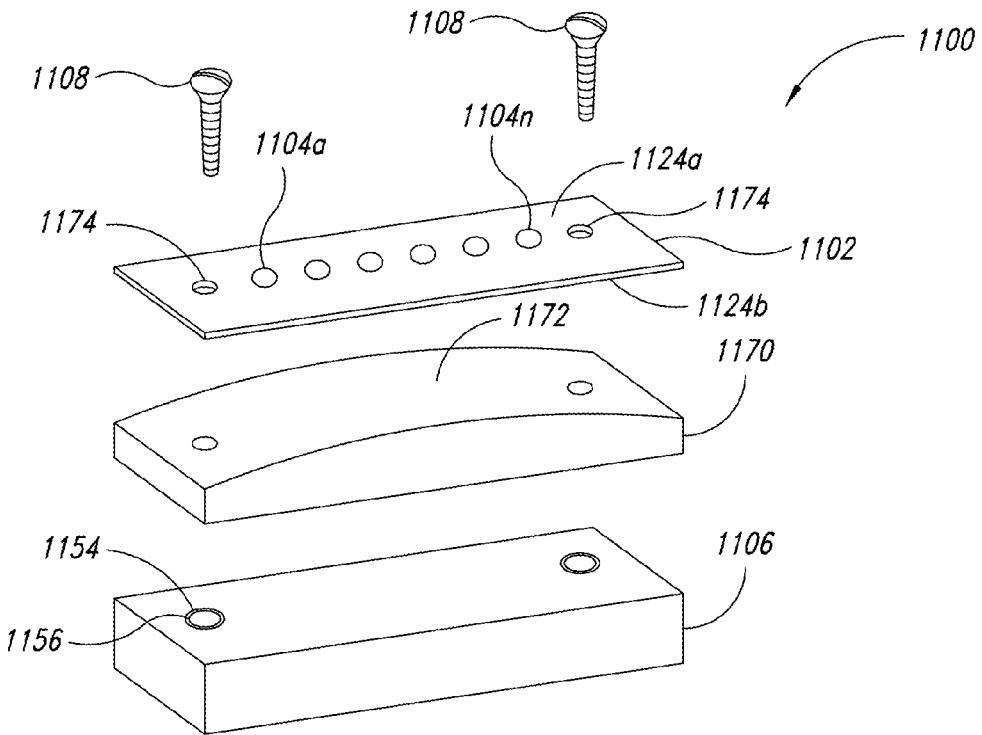
FIG. 11 is an isometric view of a lighting device according to another non-limiting illustrated embodiment, including a circuit board that carries a linear (one-dimensional) array of solid-state light sources, a heat exchanger with a flat circuit board mounting surface, and a shim having a curved surface interposed between the circuit board and the circuit board mounting surface of the heat exchanger.

FIG. 11 shows a lighting device 1100 according to another illustrated embodiment.

The lighting device 1100 may include at least one circuit board 1102, a number of solid-state light sources 1104a-1104n (only two called out, collectively 1104), a heat exchanger 1106, and a shim 1170. The circuit board 1102 carries the solid-state light sources 1004 has may have holes or apertures 1174 to receive the fasteners 1108. The circuit board 1102 is physically coupled to a circuit board mounting surface or portion 1110 of a heat exchanger 1106 via one or more fasteners 1108, for example two threaded fasteners.

Notably, the circuit board mounting surface 1110 of the heat exchanger 1106 is not curved, but rather is planar. Likewise, the opposed major outer surfaces 1124a, 1124b of the circuit board 1102 are generally planer when supported from underneath (i.e., in some embodiments the circuit board may sag under the influence of gravity). The shim 1170 has at least one surface 1172 that is curved (i.e., convex, concave). The shim 1172 may have holes or apertures sized and dimensioned to receive the fasteners 1108. Securing the circuit board 1102 to the heat exchanger 1106 with the shim 1170 intervening therebetween causes the circuit board 1102 to be curved and under tensile strain when mounted to the heat exchanger 1106. Such helps to produce the desired intimate contact to the heat exchanger 1106 through the shim 1170. The shim 1170 should be suitably thermally conductive material. Even so, such may be less effective at conducting heat away from the light emitters 1104 than other embodiments in which the circuit board and heat exchanger are in direct physical contact.

As illustrated in FIG. 11, holes or apertures 1154 (only one called out) in at least the heat exchanger 1106 may include electrically non-conductive threaded sleeves 1156 (only one called out) sized and dimensioned to receive respective ones of the fasteners 1108. Such may provide electrical isolation between the circuit board 1102, heat exchanger 1106 and/or other components of the lighting device. Any electrically conductive material of the circuit board 1102 should be spaced from holes or apertures 1154 in the circuit board 1102 if electrically conductive fasteners will or may be used.

Figure 12:
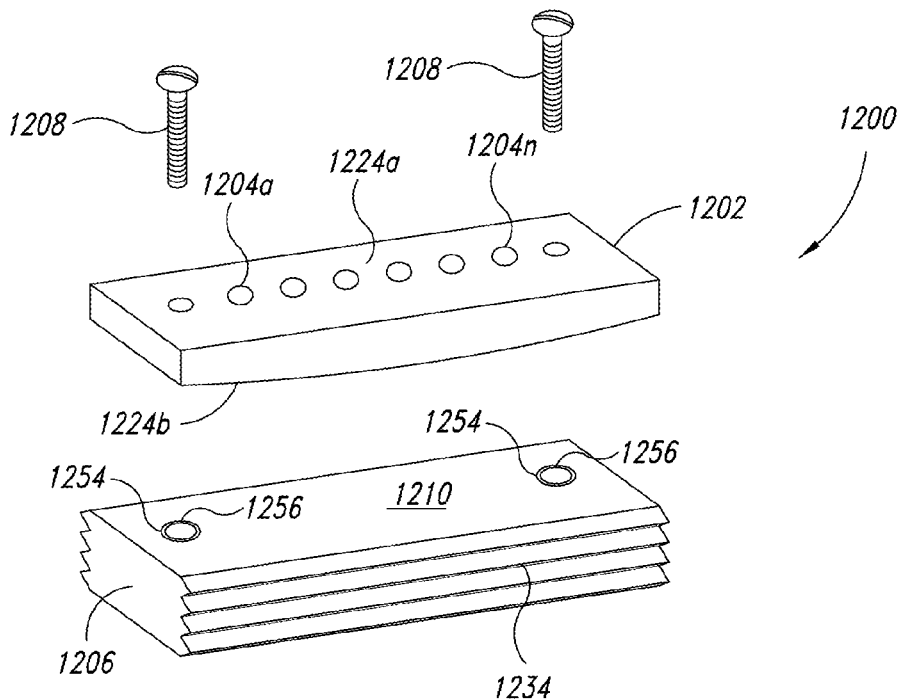
FIG. 12 is an isometric view of a lighting device according to another non-limiting illustrated embodiment, including a circuit board that carries a linear (one-dimensional) array of solid-state light sources, at least one surface of the circuit board being curved along at least one of a longitudinal or lateral dimension thereof, and a heat exchanger with a flat circuit board mounting surface.

FIG. 12 shows a lighting device 1200 according to another illustrated embodiment.

The lighting device 1200 may include at least one circuit board 1202, a number of solid-state light sources 1204a-1204n (only two called out, collectively 1204), and a heat exchanger 1206 with fins 1234. The circuit board 1202 carries the solid-state light sources 1204, and is physically coupled to a circuit board mounting surface or portion 1210 of a heat exchanger 1206 via one or more fasteners 1208, for example two threaded fasteners and nuts.

Notably, the circuit board mounting surface 1210 of the heat exchanger 1206 is not curved, but rather is planar. At least one of the opposed major outer surfaces 1224b of the circuit board 1202 is curved (e.g., convex, concave). Securing the circuit board 1202 to the heat exchanger 1206 causes the circuit board 1202 to be curved and under tensile strain when mounted. Such helps to produce the desired intimate contact to the heat exchanger 1206.

As illustrated in FIG. 12, holes or apertures 1254 in at least the heat exchanger 1206 may include electrically non-conductive threaded sleeves 1256 sized and dimensioned to receive respective ones of the fasteners 1208. Such may provide electrical isolation between the circuit board 1202, heat exchanger 1206 and/or other components of the lighting device 1200. Any electrically conductive material of the circuit board 1202 should be spaced from holes or apertures in the circuit board 1202 if electrically conductive fasteners 1208 will or may be used.

Figure 13:
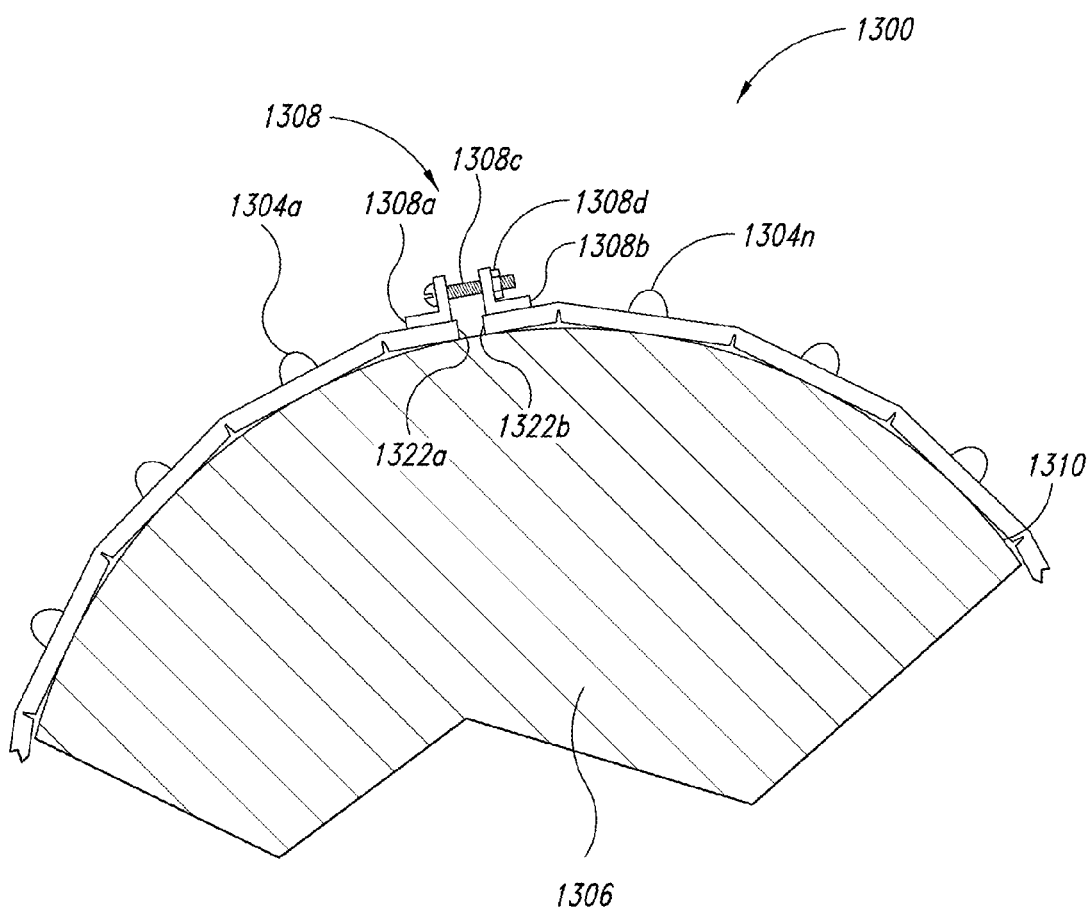
FIG. 13 is a partial side elevational view of a lighting device according to another non-limiting illustrated embodiment, including a circuit board that carries solid-state light sources, a heat exchanger and a clamp that fastens or clamps the circuit board to a curved surface of the heat exchanger such that at least one surface of the circuit board is curved along at least one of a longitudinal or lateral dimension thereof.

FIG. 13 shows a lighting device 1300 according to another non-limiting illustrated embodiment.

The lighting device 1300 may include at least one circuit board 1302 that carries a number of solid-state light sources 1304a-1304n (only two called out, collectively 1304), and a heat exchanger 1306. The circuit board 1302 includes a number of kerfs or flexures 1328a-1328n (only two called out in FIG. 13, collectively 1328) which allows the circuit board to conform to a curved circuit board mounting surface 1310 of the heat exchanger 1306 when fastened thereto.

In particular, the lighting device 1300 includes a clamp 1308 to physically coupled to the circuit board 1302 to the circuit board mounting surface or portion 1310 of the heat exchanger 1306. The clamp 1308 may take a form identical or similar to a conventional hose clamp, commonly used to fasten a hose to a pipe.

For example, the clamp 1308 may include a pair of stanchions 1308a, 1308b, each physically coupled at least proximate a respective end 1322a, 1322b of the circuit board 1302. The stanchions 1308a, 1308b may be physically coupled to the circuit board 1302 may any variety of mechanisms including other fasteners (e.g., screws, bolts, rivets) and/or adhesives. The stanchions 1308a, 1308b may each include a respective opening (not visible in FIG. 13) to receive a screw or bolt 1308c. A nut 1308d may be threadedly coupled to the screw or bolt 1308c. The nut 1308d may be selectively advanced along the screw or bolt 1308c to adjust a distance between the stanchions 1308a, 1308b, thereby tightening the circuit board 1302 around the circuit board mounting surface 1310 of the heat sink 1306 to clamp the circuit board 1302 thereto under a tensile force. Alternatively, the opening of one or both stanchions 1308a, 1308b may be threaded and sized and dimensioned to threadedly receive a thread of the screw or bolt 1308c. Such may advantageously omit the nut 1308d. The clamp 1308 may be adjusted to removably retain the circuit board 1302 to the heat exchanger 1306 by a clamping force or friction.

Also for example, while illustrated as fixed to the ends of the circuit board 1302, other clamps may be employed. For instance, the clamp 1308 may include a band or strap as is common to many styles of hose clamps. The band or strap typically includes keys (e.g., rectangular slots) which are selectively engaged by a thread of an adjustment mechanism. The adjustment mechanism works in a fashion similar to the screw or bolt 1308c, but is integral with a body of clamp. The band or strap is fixed proximate one end thereof to the body of the clamp, the opposed end of the band or strap is movably received in the body of the adjustment mechanism. Rotation of the adjustment mechanism in a first rotational direction advances the band or strap through the body of the clamp in a first direction, causing a circumference of the band or strap to decrease, tightening the clamp. Rotation of the adjustment mechanism in a second rotational direction withdraws the band or strap through the body of the clamp in a second direction, opposed to the first direction, causing a circumference of the band or strap to increase, loosening the clamp. Such may be adjusted to tighten the strap to removably retain the circuit board to the heat exchanger by a clamping force or friction. Notably, the band or strap should be positioned to engage a portion of the circuit board 1302 without physically interfering with the light sources 1304. For instance, the band or strap may overlap a peripheral edge portion of the circuit board 1302 and a portion of the circuit board mounting surface 1310 of the heat exchanger 1308.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other context, not necessarily the exemplary context of illumination devices with solid-state light emitters generally described above.

As used herein and in the claims, the term "passive" means that the heat exchanger does not consume electrical power to operate, at most using the waste heat generated by the light sources. In some embodiments, an active heat transfer device may be thermally coupled, conductively, convectively, and/or radiantly to the passive heat exchanger. While such may advantageously increase the effective rate of cooling, such might disadvantageously consume additional electrical power, increase size, complexity and/or cost.

As noted above, some heat exchangers are electrically non-conductive. Electrically non-conductive heat sinks are typically made of an electrically non-conductive polymer loaded with electrically non-conductive particles such as boron nitride or other ceramic materials. However, electrically non-conductive heat sinks tend to have very low thermal conductivity relative to metallic heat sinks that are electrically conductive. Further, electrically non-conductive heat sinks are typically more expensive than metallic heat sinks. Thus, the heat exchanger will typically be electrically conductive. Electrically non-conductive sleeves, bushings or linear may be employed to electrically isolate the various components. Alternatively, or additionally, electrically non-conductive fasteners may be used.

Although the fin-shaped protrusions are shown as having a generally rectangular shape, the fin-shaped protrusions may have other shapes, for example, triangular or trapezoidal shape, in other embodiments. Alternatively, other structures to increase surface area may be employed, for instance pin shaped protrusions. Such may be integral or a unitary part (e.g., die-cast, stamped, machined from) of the first thermally conductive element or heat exchanger or may be added thereto (e.g., soldered, welded, press fit in apertures such as through holes).

One or more embodiments may include a secondary or intermediate dielectric heat spreader that is thermally conductive and electrically non-conductive, and having an area greater than an area of the solid-state light source. The secondary or intermediate dielectric heat spreader may be positioned between the solid-state light source and/or circuit board and the heat exchanger with a periphery of the solid-state light source encompassed by the periphery of the secondary or intermediate dielectric heat spreader such that the secondary or intermediate dielectric heat spreader thermally conductively couples the solid-state light source to the heat exchanger and electrically isolates the heat exchanger from the solid-state light source and provides arc over protection between the solid-state light source and the heat exchanger. Such an arrangement may not be as efficiency at cooling the solid-state light sources as the previously illustrated structures. The secondary or intermediate dielectric heat spreader may be made of a filled polymer material. The heat exchanger may have a cavity, and the secondary or intermediate dielectric heat spreader may be received in the cavity of the heat exchanger. Such is generally taught in commonly assigned U.S. patent application Ser. No. 61/229,435 filed Jul. 29, 2009, and the various structures and concepts discussed therein can employ in the various embodiments discussed herein.

To the extent that they are not inconsistent with the teachings herein, the teachings of U.S. patent application Ser. No. 12/437,467 filed May 7, 2009; U.S. patent application Ser. No. 12/437,472 filed May 7, 2009; U.S. provisional patent application Ser. No. 61/088,651 filed Aug. 13, 2008; U.S. provisional patent application Ser. No. 61/154,619 filed Feb. 23, 2009; U.S. provisional patent application Ser. No. 61/174,913 filed May 1, 2009; U.S. provisional patent application Ser. No. 61/180,017 filed May 20, 2009, and U.S. provisional patent application Ser. No. 61/229,435 filed Jul. 29, 2009; U.S. patent application Ser. No. 12/784,091 filed May 20, 2010; and U.S. patent application Ser. No. 12/784,093 filed May 20, 2010 are each incorporated herein by reference in their entirety.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A lighting device, comprising:
   a heat exchanger having a circuit board mounting surface curved along a lateral dimension and a longitudinal dimension, the lateral dimension perpendicular to the longitudinal dimension;
   at least a first circuit board including a number of electrically insulative layers and a number of electrically conductive paths, the first circuit board having a longitudinal dimension and a lateral dimension perpendicular to the longitudinal dimension, a first major outer face, and a second major outer face, the first and the second major outer faces on opposite sides of the first circuit board from one another, at least one thickness of the first circuit board defined between the first and the second major outer faces; and
   at least two solid state light emitters carried by the first circuit board and electrically coupled to the electrically conductive paths of the first circuit board, wherein
   at least the first circuit board is physically coupled to the circuit board mounting surface, such that the longitudinal dimension of the first circuit board is curved along the longitudinal dimension of the circuit board mounting surface and the lateral dimension of the first circuit board is curved along the lateral dimension of the circuit board mounting surface.

2. The lighting device of claim 1 wherein the first circuit board is a flexible printed circuit board.

3. The lighting device of claim 1, further comprising:
   a thermally conductive interface material positioned between at least a portion of the second major outer face of the circuit board and the circuit board mounting surface.

4. The lighting device of claim 1, further comprising:
   a number of selectively removable fasteners that physically couple the first circuit board to the heat exchanger, the fasteners electrically insulated from the heat exchanger.

5. The lighting device of claim 1 wherein the first circuit board is an elongated strip with a first end and a second end, a respective portion of the first and the second ends in an overlap relationship, and further comprising:
   a single fastener received through the overlapped portions of the first and the second ends to physically couple the first circuit board to the heat exchanger.

6. The lighting device of claim 1, further comprising:
   a peripheral clamp that secures the first circuit board to the heat exchanger about a periphery of the first circuit board.

7. The lighting device of claim 6 wherein the peripheral clamp comprises a cover that is at least translucent to at least some wavelengths of light emitted by the solid state light emitters.

8. The lighting device of claim 1, further comprising:
   an electronic ballast electrically coupled to the solid state light emitters via the electrically conductive paths of the first circuit board;
   a cover that is at least translucent to at least some wavelengths of light emitted by the solid state light emitters; and
   a reflector positioned to reflect light emitted by the solid state light emitters towards the cover.

9. The lighting device of claim 1 wherein the circuit board mounting surface curved about two axes comprises a doubly convex circuit board mounting surface.

10. The lighting device of claim 1 wherein the circuit board mounting surface curved about two axes comprises a doubly concave circuit board mounting surface.

11. A lighting device comprising:
    a heat exchanger having a circuit board mounting surface curved about at least one axis;
    at least a first circuit board including a number of electrically insulative layers and a number of electrically conductive paths, the first circuit board having a longitudinal dimension and a lateral dimension, a first major outer face, and a second major outer face, the first and the second major outer faces on opposite sides of the first circuit board from one another, at least one thickness of the first circuit board defined between the first and the second major outer faces; and
    at least two solid state light emitters carried by the first circuit board and electrically coupled to the electrically conductive paths of the first circuit board, wherein
    at least the first circuit board is physically coupled to the circuit board mounting surface, the first circuit board is curved such that at least one of the longitudinal dimension or the lateral dimension corresponds to the at least one axis about which the circuit board mounting surface is curved; and
    a number of cam fasteners configured to apply a force that places the first circuit board in tension when fastened proximate the circuit board mounting surface.

12. The lighting device of claim 11 wherein the heat exchanger has a heat dissipation surface including a plurality of fins, the circuit board mounting surface proximate the first circuit board relative to the heat dissipation surface.

13. The lighting device of claim 11 wherein the circuit board mounting surface of the heat exchanger is convex along at least one of the longitudinal dimension or the lateral dimension thereof.

14. The lighting device of claim 11 wherein the circuit board mounting surface of the heat exchanger is concave along at least one of the longitudinal dimension or the lateral dimension thereof.

15. The lighting device of claim 11 wherein the heat exchanger has a heat dissipation surface, the circuit board mounting surface proximately adjacent the second major outer face of the first circuit board, at least the second major outer face curved along at least one of the longitudinal dimension or the lateral dimension before the first circuit board is physically coupled to the heat exchanger.

16. The lighting device of claim 11, further comprising:
a shim received between the heat exchanger and the first circuit board, the shim having at least one surface that is curved along at least one of a longitudinal dimension or a lateral dimension thereof before the shim is received between the heat exchanger and the first circuit board.

17. A lighting device comprising:
a heat exchanger having a circuit board mounting surface curved along both a lateral dimension and a longitudinal dimension, the lateral dimension perpendicular to the longitudinal dimension;
at least a first circuit board including a number of electrically insulative layers and a number of electrically conductive paths, the first circuit board having a first major outer face, and a second major outer face, the first and the second major outer faces on opposite sides of the first circuit board from one another, at least one thickness of the first circuit board defined between the first and the second major outer faces; and
at least two solid state light emitters carried by the first circuit board and electrically coupled to the electrically conductive paths of the first circuit board, wherein
at least the first circuit board is physically coupled to the circuit board mounting surface, such that a longitudinal dimension of the first circuit board is curved along the longitudinal dimension of the circuit board mounting surface and a lateral dimension of the first circuit board, that is perpendicular to the longitudinal dimension of the first circuit board, is curved along the lateral dimension of the circuit board mounting surface; and
a number of cam fasteners configured to apply a compressive force to the first circuit board when fastened.

18. A method of constructing a lighting device, the method comprising:
providing a heat exchanger having a circuit board mounting face curved along both a longitudinal dimension and a lateral dimension, the lateral dimension perpendicular to the longitudinal dimension, and a plurality of fins;
providing at least one circuit board having a number of kerfs and a number of flats separate by the kerfs, the circuit board having a longitudinal dimension and a lateral dimension that is perpendicular to the longitudinal dimension, the circuit board carrying at least two solid state light emitters positioned at the flats between the kerfs; and
removably physically coupling the circuit board to the heat exchanger under at least one of a tensile or a compressive force with at least one fastener including at least one cam fastener that applies at least one of an additional tensile force or an additional compressive force to the circuit board such that the longitudinal dimension of the first circuit board is curved along the longitudinal dimension of the circuit board mounting face and the lateral dimension of the first circuit board is curved along the lateral dimension of the circuit board mounting face when the circuit board is physically coupled to the heat exchanger circuit board mounting face by the at least one fastener.

19. The method of claim 18 wherein removably physically coupling the circuit board to the heat exchanger with at least one fastener includes removably physically coupling the circuit board to the heat exchanger with a single fastener.

20. The method of claim 18 wherein removably physically coupling the circuit board to the heat exchanger with at least one fastener includes removably physically coupling the circuit board to the heat exchanger with a peripheral clamp.

* * * * *